(12) United States Patent
Furihata et al.

(10) Patent No.: US 9,299,875 B2
(45) Date of Patent: Mar. 29, 2016

(54) MANUFACTURE OF SOLAR CELL MODULE

(71) Applicant: Shin-Etsu Chemical Co., Ltd., Tokyo (JP)

(72) Inventors: Tomoyoshi Furihata, Annaka (JP); Hiroto Ohwada, Annaka (JP); Junichi Tsukada, Annaka (JP); Atsuo Ito, Annaka (JP); Atsushi Yaginuma, Annaka (JP); Naoki Yamakawa, Annaka (JP); Minoru Igarashi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/461,712

(22) Filed: Aug. 18, 2014

(65) Prior Publication Data

US 2015/0064831 A1    Mar. 5, 2015

(30) Foreign Application Priority Data

Aug. 30, 2013  (JP) ................................. 2013-179827
Jun. 4, 2014   (JP) ................................. 2014-115750

(51) Int. Cl.
*H01L 31/18* (2006.01)
*H01L 31/048* (2014.01)

(52) U.S. Cl.
CPC ............ *H01L 31/18* (2013.01); *H01L 31/0481* (2013.01)

(58) Field of Classification Search
CPC ... H01L 31/0481; H01L 31/048; H01L 31/18; H01L 31/049; H01L 31/0203; H01L 2924/0002; H01L 31/035281; H01L 2924/00; H01L 31/1804; H01L 31/022425
See application file for complete search history.

(56) References Cited

U.S. PATENT DOCUMENTS

| 8,076,002 | B2 | 12/2011 | Ochs et al. |
| 2008/0276983 | A1 | 11/2008 | Drake et al. |
| 2011/0061724 | A1 | 3/2011 | Houle et al. |
| 2012/0186631 | A1 | 7/2012 | Terreau et al. |
| 2013/0298989 | A1* | 11/2013 | Tomizawa et al. ............ 136/258 |

FOREIGN PATENT DOCUMENTS

| JP | 2007-527109 A | 9/2007 |
| JP | 2009-515365 A | 4/2009 |

(Continued)

OTHER PUBLICATIONS

Ohl, S., et al., "Increased internal quantum efficiency of encapsulated solar cell by using two-component silicone as encapsulant material", Proc. 23rd, EU PVSEC, Valencia, 2008, pp. 2693-2697, cited in Specification.

Ketola, Barry, et al., "Demonstration of the benefits of silicone encapsulation of PV modules in a large scale outdoor array", Dow Corning Corporation, USA, Dec. 27, 2010, cited in Specification.

(Continued)

*Primary Examiner* — Tony Tran
(74) *Attorney, Agent, or Firm* — Westerman, Hattori, Daniels & Adrian, LLP

(57) ABSTRACT

A solar cell module is manufactured by encapsulating a solar cell matrix comprising a plurality of electrically connected solar cell components between a transparent panel and a backsheet with a resin. The method involves (i) embossing opposite surfaces of a green silicone rubber sheet, (ii) arranging a transparent panel (13*a*), silicone rubber sheet (11), solar cell matrix (14), silicone rubber sheet (11), and backsheet (13*b*) to form a multilayer assembly, and (iii) heating and compressing the assembly for vacuum lamination for establishing a seal around the solar cell matrix.

18 Claims, 9 Drawing Sheets

(56) References Cited

FOREIGN PATENT DOCUMENTS

| | | |
|---|---|---|
| JP | 2010-505670 A | 2/2010 |
| JP | 2011-514680 A | 5/2011 |

OTHER PUBLICATIONS

Ito, A., et al., pre-prints of 9th "next generation solar power system", symposium, Japan, 2012, p. 54-57, cited in Specification.

* cited by examiner

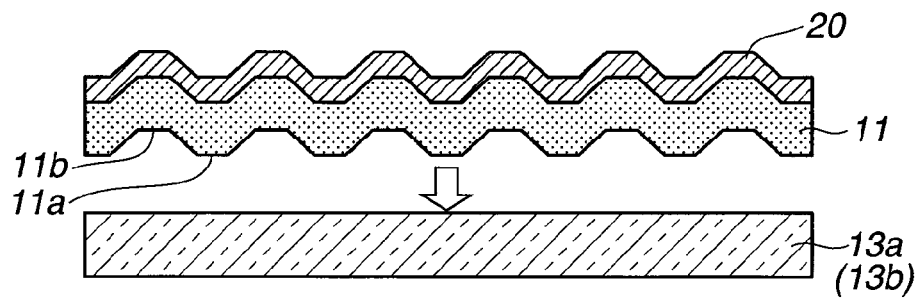
FIG.3A
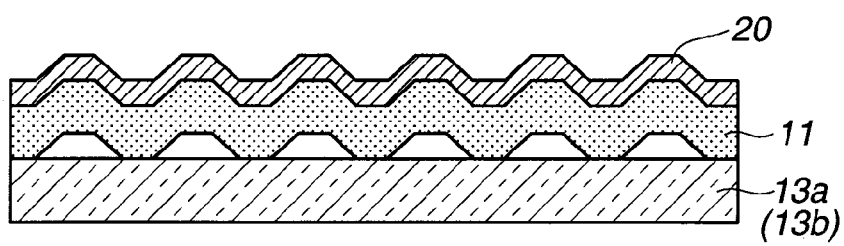
FIG.3B
FIG.4
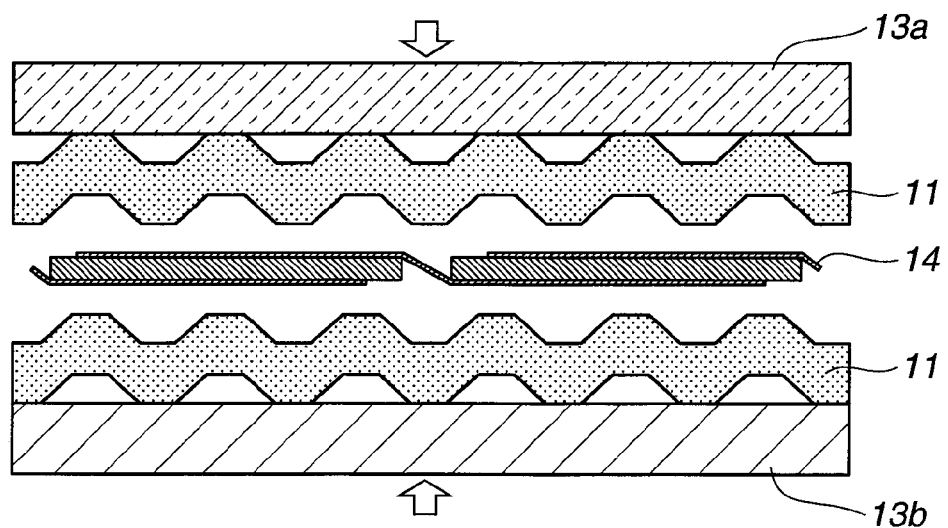

MANUFACTURE OF SOLAR CELL MODULE

CROSS-REFERENCE TO RELATED APPLICATION

This non-provisional application claims priority under 35 U.S.C. §119(a) on Patent Application Nos. 2013-179827 and 2014-115750 filed in Japan on Aug. 30, 2013 and Jun. 4, 2014, respectively, the entire contents of which are hereby incorporated by reference.

TECHNICAL FIELD

This invention relates to a method for manufacturing a solar cell module by encapsulating a solar cell matrix with resin.

BACKGROUND ART

To provide solar cell modules with enhanced conversion efficiency and long-term reliability over 20 to 30 years or even longer, a number of reports and proposals relating to encapsulants were made in the art. From the standpoint of efficiency enhancement, the silicone material is reported to be superior in internal quantum efficiency due to light transmittance at wavelength of about 300 to 400 nm, as compared with the ethylene-vinyl acetate copolymer (EVA) which is currently the mainstream of encapsulant (see Non-Patent Document 1, for example). In fact, an experiment to compare the output power of solar modules using EVA and silicone material as encapsulant is reported (see Non-Patent Document 2, for example). From the standpoint of long-term reliability, it is reported that modules using silicone as the encapsulant experience only a percent deterioration of maximum power as low as −0.22%/year even after 29-year outdoor exposure (see Non-Patent Document 3, for example).

Originally, the use of silicone material as encapsulant was already implemented in the early period of 1970s when solar cell modules for spacecraft were fabricated. Historically, in the stage when solar cell modules for ground applications were manufactured, the silicone material was replaced by EVA because the silicone material had outstanding problems including material cost and workability for encapsulation whereas the EVA was inexpensive and supplied in film form. Recently, the efficiency enhancement and long-term reliability of solar cells are highlighted again. Accordingly, the properties of silicone material as encapsulant, for example, low modulus, high transparency and weather resistance are considered valuable again. Several encapsulating methods using silicone material are newly proposed.

With respect to the use of silicone sheets, for example, Patent Document 1 discloses encapsulation using a sheet of organopolysiloxane-based hot melt material. However, it is difficult to work the polysiloxane into a sheet while maintaining high transparency. When the polysiloxane is shaped into a sheet of about 1 mm thick, for example, only a particular shaping technique such as casting or pressing is applicable due to the "brittleness" of the material. This shaping technique is unsuitable for mass-scale production. Patent Document 2 proposes a thermoplastic silicone sheet made of a polysiloxane-urea base copolymer. This copolymer may be inferior to the polysiloxane with respect to transparency on the short-wavelength side, and a more cost be required for copolymer preparation.

With respect to the use of liquid silicone material, Patent Document 3 discloses that interconnected solar cells are positioned on or in a liquid silicone material coated on a substrate, using a multi-axis robot. The liquid silicone material is then cured, thereby achieving encapsulation without trapping air bubbles. Further, Patent Document 4 proposes that a solar cell is placed in vacuum, and the components are compressed using a cell press having a movable plate, thereby achieving encapsulation without trapping air bubbles. Since either of these methods differs significantly from the conventional solar cell encapsulating methods, there is a possibility that the existing mass-production systems cannot be used.

Another known encapsulation method is by coating two glass plates with a silicone composition, sandwiching a solar cell matrix between the coated glass plates in vacuum, and heating the assembly for curing. However, the procedure of coating the silicone composition, overlapping the coatings, and curing has several problems. Because of the low viscosity of the silicone composition, if the coated surface is faced vertically downward, the coating will flow, resulting in a variation of coating thickness. Thus, coating and curing treatments must be conducted on a horizontal platen, and the equipment used in mass-scale manufacture becomes of large size. When the coating is faced downward after curing, the coating is inhibited from flowing. However, once silicone composition coatings are cured, they are not bonded together even when overlapped. Eventually, it is required to dispense the silicone composition in vacuum and to introduce a large-size equipment.

Because of process complexity as mentioned above, the attempt to apply a silicone material to the mass-scale manufacture of solar cell modules to take advantage of the low modulus of silicone material has marked no further advances.

CITATION LIST

Patent Document 1: JP-A 2009-515365 (US 20080276983)
Patent Document 2: JP-A 2010-505670
Patent Document 3: JP-A 2007-527109
Patent Document 4: JP-A 2011-514680 (US 20110061724)
Non-Patent Document 1: S. Ohl, G. Hahn, "Increased internal quantum efficiency of encapsulated solar cell by using two-component silicone as encapsulant material", Proc. 23rd, EU PVSEC, Valencia (2008), pp. 2693-2697
Non-Patent Document 2: Barry Ketola, Chris Shirk, Phillip Griffith, Gabriela Bunea, "Demonstration of the benefits of silicone encapsulation of PV modules in a large scale outdoor array", Dow Corning Corporation
Non-Patent Document 3: A. Ito, H. Owada, T. Furihata, T. Kim, N. Yamakawa, A. Yaginuma, T. Imataki, M. Watanabe, and S. Sakamoto, pre-prints of 9th next generation solar power system symposium, 2012, p. 54

DISCLOSURE OF INVENTION

An object of the invention is to provide a method for manufacturing a solar cell module with improved durability by encapsulating a matrix of solar cell components between two panels with green silicone rubber sheets as the encapsulant while preventing air bubbles from being trapped in and without causing damages to the solar cell components, the method enabling to use an existing solar module manufacturing apparatus.

The invention provides a method for manufacturing a solar cell module as defined below.

[1] A method for manufacturing a solar cell module by resin encapsulating a solar cell matrix comprising a plurality of electrically connected solar cell components arranged between a transparent panel and a second panel or backsheet, comprising the steps of:

(1) providing a first laminate by laminating a green silicone rubber sheet of a millable silicone rubber composition to one surface of the transparent panel, the silicone rubber sheet having a predetermined pattern of recesses and bosses on its surface, (2) providing a second laminate by laminating a green silicone rubber sheet of a millable silicone rubber composition to one surface of the second panel or backsheet, the silicone rubber sheet having a predetermined pattern of recesses and bosses on its surface, and (3) mating the first and second laminates together such that the patterned surfaces of the silicone rubber sheets may be opposed to each other, placing the solar cell matrix between the first and second laminates, pumping a space surrounding the laminates to vacuum, compressing and heating the first and second laminates in vacuum to cure the silicone rubber sheets for establishing a seal around the solar cell matrix.

[2] The method of [1] wherein step (1) includes embossing at least one surface of the green silicone rubber sheet of silicone rubber composition and laminating the embossed silicone rubber sheet to the surface of the transparent panel such that the embossed surface of the silicone rubber sheet may be disposed remote from the transparent panel.

[3] The method of [1] or [2] wherein step (2) includes embossing at least one surface of the green silicone rubber sheet of silicone rubber composition and laminating the embossed silicone rubber sheet to the surface of the second panel or backsheet such that the embossed surface of the silicone rubber sheet may be disposed remote from the second panel or backsheet.

[4] The method of [2] or [3] wherein both surfaces of the green silicone rubber sheet are embossed.

[5] The method of [4] wherein the embossing step is carried out by pressing two sheet-form templates having a patterned surface against opposite surfaces of the green silicone rubber sheet.

[6] The method of [5], further comprising the steps of separating one template from either one surface of the green silicone rubber sheet, laminating the embossed surface of the green silicone rubber sheet to the transparent panel, second panel or backsheet so that recesses of the emboss structure may not collapse, then separating the other template from the opposite surface of the green silicone rubber sheet, prior to step (3).

[7] The method of [1] wherein step (1) includes laminating the green silicone rubber sheet of silicone rubber composition to one surface of the transparent panel and embossing the surface of the silicone rubber sheet laminated to the transparent panel.

[8] The method of [1] or [7] wherein step (2) includes laminating the green silicone rubber sheet of silicone rubber composition to one surface of the second panel or backsheet and embossing the surface of the silicone rubber sheet laminated to the second panel or backsheet.

[9] The method of [7] or [8] wherein the step of laminating the green silicone rubber sheet to the transparent panel, second panel or backsheet is carried out using a laminator comprising a pressure roller.

[10] The method of any one of [7] to [9] wherein the step of laminating the green silicone rubber sheet to the transparent panel, second panel or backsheet is carried out in vacuum.

[11] The method of any one of [7] to [10] wherein the embossing step includes using a roll having a patterned surface as the template and pressing the roll against the green silicone rubber sheet.

[12] The method of any one of [1] to [11] wherein the green silicone rubber sheet has a thickness of 0.3 to 2 mm.

[13] The method of any one of [1] to [12] wherein step (3) includes resting the solar cell matrix on the silicone rubber sheet of the first or second laminate, mating the first and second laminates with the silicone rubber sheets inside, heating and compressing the first and second laminates in vacuum to cure the silicone rubber sheets for establishing a seal around the solar cell matrix.

[14] The method of any one of [1] to [13] wherein step (3) includes heating at a temperature of 70 to 150° C.

[15] The method of any one of [1] to [14] wherein the backsheet is a composite sheet consisting of a polyethylene terephthalate resin film coated on both surfaces with vinyl fluoride resin films.

[16] The method of any one of [1] to [15] wherein the silicone rubber composition comprises (A) 100 parts by weight of an organopolysiloxane containing at least two alkenyl groups per molecule and having a degree of polymerization of at least 100, represented by the average compositional formula (I):

$$R^1{}_a SiO_{(4-a)/2} \quad (I)$$

wherein $R^1$ is independently a substituted or unsubstituted monovalent hydrocarbon group and a is a positive number of 1.95 to 2.05, (B) 10 to 150 parts by weight of reinforcing silica having a specific surface area of at least 50 $m^2/g$, and (C) a sufficient amount to cure component (A) of a curing agent.

[17] The method of [16] wherein component (C) is a combination of organohydrogenpolysiloxane with a hydrosilylation catalyst, or an organic peroxide.

Advantageous Effects of Invention

In the method for manufacturing a solar cell module according to the invention, a matrix of solar cell components is sandwiched between green silicone rubber sheets laminated to a transparent panel and a second panel or backsheet in vacuum (or reduced pressure), while the surface of the green silicone rubber sheet provided with a predetermined pattern of recesses and bosses, that is, the embossed surface is contiguous with the solar cell matrix. The sandwich structure is compressed. Thus the solar cell matrix is encapsulated while preventing air bubbles from being trapped in (i.e., pore formation) and without causing damage to the solar cell components. The transparent panel having the green silicone rubber sheet laminated thereto and the second panel or backsheet having the green silicone rubber sheet laminated thereto are heated and compressed in vacuum, which causes the silicone rubber sheets to cure for tightly encapsulating the solar cell matrix inside. The seal prevents any ingress of moisture or gas through the side edges of the module. Thus a solar cell module with improved durability is manufactured. The inventive method can be implemented by the existing solar module manufacturing apparatus adapted for EVA film, typically vacuum laminator (or module laminator). Thus, solar cell modules can be manufactured without a need for a newly designed apparatus capable of coating liquid silicone material.

Also, when the green silicone rubber sheet is embossed, a template in sheet or roll form having an embossing pattern is pressed against the green silicone rubber sheet to transfer the embossing pattern to the silicone rubber sheet. Then the green silicone rubber sheet which is flexible in the uncured state can be uniformly embossed without causing any damages thereto.

BRIEF DESCRIPTION OF DRAWINGS

FIGS. 3A and 3B are cross-sectional views of the step of laminating the silicone rubber sheet to a panel in the method for manufacturing a solar cell module according to the first embodiment of the invention, (a) showing the sheet prior to laminating and (b) showing the sheet as laminated.

FIG. 4 is a cross-sectional view of an exemplary multilayer arrangement of solar cell module components in the method for manufacturing a solar cell module according to the first embodiment of the invention.

DESCRIPTION OF PREFERRED EMBODIMENTS

Figure 1A:
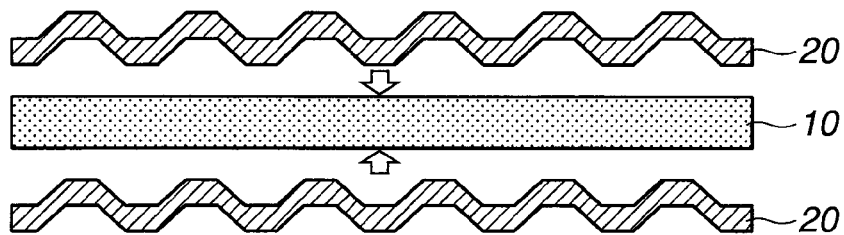
FIGS. 1A and 1B are cross-sectional views of the step of embossing a silicone rubber sheet in the method for manufacturing a solar cell module according to a first embodiment of the invention, FIG. 1A showing the sheet prior to embossing and FIG. 1B showing the sheet as embossed.

In the following description, like reference characters designate like or corresponding parts throughout the several views shown in the figures. The terms "first", "second", and the like, as used herein do not denote any order, quantity, or importance, but rather are used to distinguish one element from another. It is also understood that terms such as "above," "below," "outward," "inward," and the like are words of convenience and are not to be construed as limiting terms. As used herein, the term "green" indicates uncured or unvulcanized.

The invention relates to a method for manufacturing a solar (or photovoltaic) cell module by resin encapsulating a solar cell matrix comprising a plurality of electrically connected solar cell components regularly arranged between a transparent panel and a second panel or backsheet. The method is characterized by comprising the steps of:

(1) providing a first laminate by laminating a green silicone rubber sheet of a millable silicone rubber composition to one surface of the transparent panel, the silicone rubber sheet having a predetermined pattern of recesses and bosses on its surface, (2) providing a second laminate by laminating a green silicone rubber sheet of a millable silicone rubber composition to one surface of the second panel or backsheet, the silicone rubber sheet having a predetermined pattern of recesses and bosses on its surface, and (3) mating the first and second laminates together such that the patterned surfaces of the silicone rubber sheets may be opposed to each other, placing the solar cell matrix between the first and second laminates, pumping a space surrounding the laminates to vacuum, compressing and heating the first and second laminates in vacuum to cure the silicone rubber sheets for establishing a seal around the solar cell matrix.

Referring to the drawings, preferred embodiments of the method for manufacturing a solar cell module according to the invention are described.

First Embodiment

In the first embodiment of the method for manufacturing a solar cell module according to the invention, step (1) includes embossing at least one surface of a green silicone rubber sheet of the silicone rubber composition and laminating the embossed silicone rubber sheet to the surface of the transparent panel such that the embossed surface of the silicone rubber sheet may be disposed remote from the transparent panel. Also, step (2) includes embossing at least one surface of a green silicone rubber sheet of silicone rubber composition and laminating the embossed silicone rubber sheet to the surface of the second panel or backsheet such that the embossed surface of the silicone rubber sheet may be disposed remote from the second panel or backsheet.

In the first embodiment of the method according to the invention, a solar cell module is manufactured by resin encapsulating a solar cell matrix comprising a plurality of electrically connected solar cell components regularly arranged between a transparent panel and a second panel or between a transparent panel and a backsheet. Preferably the method comprises the steps of:

(i) embossing at least one surface of each of two green silicone rubber sheets made of a silicone rubber composition comprising (A) 100 parts by weight of an organopolysiloxane containing at least two alkenyl groups per molecule and having a degree of polymerization of at least 100, represented by the average compositional formula (I):

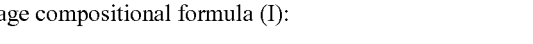

wherein $R^1$ is independently a substituted or unsubstituted monovalent hydrocarbon group and a is a positive number of 1.95 to 2.05, (B) 10 to 150 parts by weight of reinforcing silica having a specific surface area of at least 50 m²/g, and (C) a sufficient amount to cure component (A) of a curing agent, (ii) laminating one embossed silicone rubber sheet to one surface of the transparent panel such that the embossed surface of the silicone rubber sheet may be disposed remote from the transparent panel, and laminating the other embossed silicone rubber sheet to one surface of the second panel or backsheet such that the embossed surface of the silicone rubber sheet may be disposed remote from the second panel or backsheet, and (iii) resting the solar cell matrix on the silicone rubber sheet on the transparent panel or the second panel or backsheet, overlapping the transparent panel with the second panel or backsheet into a multilayer assembly such that the silicone rubber sheets may be inside, heating and compressing the assembly in vacuum to cure the silicone rubber sheets for establishing a seal around the solar cell matrix.

(i) Embossing Step

Figure 1B:
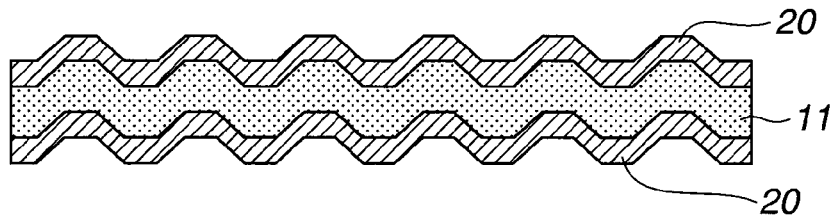

As shown in FIG. 1, the embossing step (i) is carried out by pressing a sheet-form template 20 against at least one surface of a green silicone rubber sheet 10, preferably two sheet-form templates 20 against opposite surfaces of a green silicone rubber sheet 10.

The green silicone rubber sheets are made of a millable silicone rubber composition comprising (A) an organopolysiloxane, (B) reinforcing silica, and (C) a curing agent.

Component (A) is an organopolysiloxane containing at least two alkenyl groups per molecule and having a degree of polymerization of at least 100, represented by the average compositional formula (I):

$$R^1_a SiO_{(4-a)/2} \quad (I)$$

wherein $R^1$ is independently a substituted or unsubstituted monovalent hydrocarbon group and a is a positive number of 1.95 to 2.05.

In formula (1), $R^1$ is each independently a substituted or unsubstituted monovalent hydrocarbon group, typically of 1 to 12 carbon atoms, preferably 1 to 8 carbon atoms. Examples of the monovalent hydrocarbon group include alkyl groups such as methyl, ethyl, propyl, butyl, hexyl, and octyl, cycloalkyl groups such as cyclopentyl and cyclohexyl, alkenyl groups such as vinyl, allyl and propenyl, cycloalkenyl groups, aryl groups such as phenyl and tolyl, aralkyl groups such as benzyl and 2-phenylethyl, and substituted forms of the foregoing in which some or all hydrogen atoms are substituted by halogen atoms (e.g., fluorine, bromine and chlorine), cyano or the like. Inter alia, methyl, vinyl, phenyl and trifluoropropyl are preferred, with methyl and vinyl being most preferred.

Preferred are those organopolysiloxanes in which the recurring structure of diorganosiloxy units ($R^1_2SiO_{2/2}$ wherein $R^1$ is as defined above) to constitute the backbone consists of dimethylsiloxane units, and modified forms of the foregoing in which diorganosiloxane units having a substituent group such as phenyl, vinyl or 3,3,3-trifluoropropyl, for example, diphenylsiloxane units, methylphenylsiloxane units, methylvinylsiloxane units, or methyl-3,3,3-trifluoropropylsiloxane units, are introduced as part of the dimethylpolysiloxane structure composed of recurring dimethylsiloxane units to constitute the backbone.

Also preferably, the molecular chain is capped at both ends with a triorganosiloxy group ($R^1_3SiO_{1/2}$) such as trimethylsiloxy, dimethylphenylsiloxy, vinyldimethylsiloxy, divinylmethylsiloxy or trivinylsiloxy, or a hydroxydiorganosiloxy group ($R^1_2(HO)SiO_{1/2}$) such as hydroxydimethylsiloxy. Inter alia, trivinylsiloxy is most preferred because of higher reactivity.

The organopolysiloxane as component (A) should have at least two silicon-bonded alkenyl groups per molecule. It typically contains 2 to 50, especially 2 to 20 alkenyl groups, specifically vinyl groups. It is preferred that alkenyl groups account for 0.01 to 20 mol %, especially 0.02 to 10 mol % of all $R^1$. The alkenyl group may be bonded to a silicon atom at the end of the molecular chain or a silicon atom at an intermediate (or non-terminal) position of the molecular chain, or both. It is preferred that the alkenyl group be bonded to at least a silicon atom at the end of the molecular chain.

The subscript "a" is a number of 1.95 to 2.05, preferably 1.98 to 2.02, and more preferably 1.99 to 2.01. It is desired that at least 90 mol %, preferably at least 95 mol % of all $R^1$, and more preferably all $R^1$ exclusive of alkenyl groups be alkyl groups, especially methyl.

The organopolysiloxane may be obtained from (co)hydrolytic condensation of one or more organohalogenosilanes, or ring-opening polymerization of a cyclic polysiloxane (e.g., siloxane trimer or tetramer) in the presence of an alkaline or acidic catalyst. The resulting product is basically a linear diorganopolysiloxane although component (A) may be a mixture of two or more organopolysiloxanes having different molecular weight (degree of polymerization) or molecular structure.

The organopolysiloxane should have a degree of polymerization of at least 100, specifically 100 to 100,000, preferably 2,000 to 50,000, and more preferably 3,000 to 20,000. Preferably it exhibits no self-flow at room temperature (25° C.), that is, it is gum-like or non-liquid. If the degree of polymerization is too low, the resulting compound tends to stick to rolls and interferes with rolling operation. It is noted that the degree of polymerization is measured as a weight average degree of polymerization versus polystyrene standards by gel permeation chromatography (GPC) using toluene as developing solvent.

Component (B) is reinforcing silica which is added to provide a silicone rubber composition with enhanced mechanical strength and transparency.

To impart mechanical strength, silica should have a specific surface area of at least 50 m²/g, preferably 100 to 450 m²/g, and more preferably 100 to 300 m²/g, as measured by the BET adsorption method. If the surface area is less than 50 m²/g, the cured product may have low mechanical strength. To provide the cured silicone rubber with high transparency at a wavelength of 300 nm or shorter, the surface area is preferably at least 200 m²/g, and more preferably at least 250 m²/g. A surface area in this range ensures that a cured sheet of the silicone rubber composition with a thickness of 2 mm has a total light transmittance of at least 90% and a haze value of up to 10.

Examples of the reinforcing silica include fumed silica (or dry silica) and precipitated silica (or wet silica). Also useful is silica which has been surface treated with chlorosilane or hexamethyldisilazane to be hydrophobic. Of these, fumed silica having dynamic fatigue durability is most preferred. Component (B) may be used alone or in admixture of two or more.

The reinforcing silica as component (B) may be a commercially available one. For example, hydrophilic or hydrophobic fumed silica which has not been or has been subjected to hydrophobic surface treatment is commercially available under the trade name of Aerosil® 130, 200, 300, R-812, R-972, and R-974 from Nippon Aerosil Co., Ltd., Cabosil® MS-5 and MS-7 from Cabot Corp., Reolosil® QS-102, QS-103 and MT-10 from Tokuyama Corp. Precipitated silica which has not been or has been subjected to hydrophobic surface treatment is commercially available under the trade name of Tokusil® US-F from Tokuyama Corp., and Nipsil® SS and LP series from Nippon Silica Co., Ltd.

The reinforcing silica as component (B) is used in an amount of 10 to 150 parts, preferably 50 to 120 parts, and more preferably 70 to 100 parts by weight per 100 parts by weight of the organopolysiloxane as component (A). Outside the range, less amounts of component (B) used may achieve insufficient reinforcing effect and detract from transparency of cured silicone rubber compound whereas too much amounts of component (B) may be difficult to disperse in the silicone polymer and adversely affect processability and mechanical strength.

Component (C) is a curing agent, which is not particularly limited as long as it serves to cure component (A). It may be any well-known rubber curing agent, preferably (a) an addition reaction or hydrosilylation curing agent, that is, a combination of organohydrogenpolysiloxane (or crosslinker) with a hydrosilylation catalyst, or (b) an organic peroxide.

In the addition reaction or hydrosilylation curing agent (a), the organohydrogenpolysiloxane serves as a crosslinker. It may be any of well-known organohydrogenpolysiloxanes which have at least two silicon-bonded hydrogen atoms (that is, SiH groups) per molecule and are represented by the following average compositional formula (II).

$$R^2{}_b H_c SiO_{(4-b-c)/2} \qquad (II)$$

Herein $R^2$ is each independently a substituted or unsubstituted monovalent hydrocarbon group, b is a positive number of 0.7 to 2.1, c is a positive number of 0.01 to 1.0, and the sum of b and c is from 0.8 to 3.0.

Herein, $R^2$ is a substituted or unsubstituted monovalent hydrocarbon group of 1 to 8 carbon atoms, and preferably free of aliphatic unsaturation. Examples include alkyl groups such as methyl, ethyl, propyl, isopropyl, butyl, isobutyl, tert-butyl, pentyl, and hexyl, cycloalkyl groups such as cyclohexyl, aryl groups such as phenyl, aralkyl groups such as benzyl, and substituted forms of the foregoing hydrocarbon groups in which some or all hydrogen atoms are replaced by halogen atoms (e.g., fluorine, chlorine and bromine), cyano or the like, such as 3,3,3-trifluoropropyl and cyanomethyl. The subscript b is a positive number of 0.7 to 2.1, preferably 0.8 to 2.0, c is a positive number of 0.01 to 1.0, preferably 0.1 to 1.0, more preferably 0.18 to 1.0, and even more preferably 0.2 to 1.0, and b+c is from 0.8 to 3.0, preferably from 1.0 to 2.5.

The molecular structure of the organohydrogenpolysiloxane may be linear, cyclic, branched or three-dimensional network. Preferred are those organohydrogenpolysiloxanes which are liquid at room temperature (25° C.) and have a number of silicon atoms per molecule or degree of polymerization of 2 to 300, especially 4 to 200. The silicon-bonded hydrogen, i.e., SiH group may be positioned at the end or an intermediate of the molecular chain or both. Preferred are those organohydrogenpolysiloxanes which contain at least 2 SiH groups (specifically 2 to 300 SiH groups), preferably at least 3 SiH groups (specifically 3 to 200 SiH groups), and more preferably 4 to 150 SiH groups per molecule.

Illustrative examples of the organohydrogenpolysiloxane include 1,1,3,3-tetramethyldisiloxane, 1,3,5,7-tetramethylcyclotetrasiloxane, methylhydrogencyclopolysiloxane, methylhydrogensiloxane/dimethylsiloxane cyclic copolymers, tris(dimethylhydrogensiloxy)methylsilane, tris(dimethylhydrogensiloxy)phenylsilane, both end trimethylsiloxy-blocked methylhydrogenpolysiloxane, both end trimethylsiloxy-blocked dimethylsiloxane/methyl-hydrogensiloxane copolymers, both end dimethylhydrogensiloxy-blocked dimethylpolysiloxane, both end dimethylhydrogensiloxy-blocked dimethylsiloxane/methylhydrogensiloxane copolymers, both end trimethylsiloxy-blocked methylhydrogensiloxane/diphenylsiloxane copolymers, both end trimethylsiloxy-blocked methylhydrogen-siloxane/diphenylsiloxane/dimethylsiloxane copolymers, cyclic methylhydrogenpolysiloxane, cyclic methylhydrogensiloxane/dimethylsiloxane copolymers, cyclic methylhydrogensiloxane/diphenylsiloxane/dimethylsiloxane copolymers, copolymers of $(CH_3)_2HSiO_{1/2}$ units and $SiO_{4/2}$ units, and copolymers of $(CH_3)_2HSiO_{1/2}$ units, $SiO_{4/2}$ units and $(C_6H_5)SiO_{3/2}$ units. Also included are modified forms of the foregoing in which some or all methyl groups are replaced by alkyl groups (e.g., ethyl and propyl) or aryl groups (e.g., phenyl). Specific examples of the organohydrogenpolysiloxane are shown by the following structural formulae.

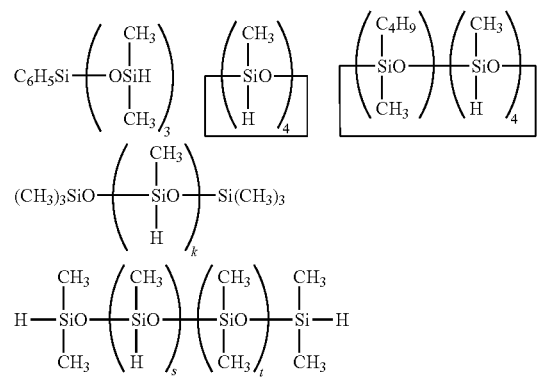

Herein k is an integer of 2 to 10, s and t each are an integer of 0 to 10.

Preferably the organohydrogenpolysiloxane has a viscosity at 25° C. of 0.5 to 10,000 mPa·s, more preferably 1 to 300 mPa·s, as measured by a rotational viscometer.

The organohydrogenpolysiloxane is blended in such amounts that a molar ratio of silicon-bonded hydrogen (i.e., SiH groups) in the organohydrogenpolysiloxane to silicon-bonded aliphatic unsaturated groups (e.g., alkenyl) in component (A) may fall in the range of 0.5 to 10 mol/mol, preferably 0.8 to 6 mol/mol, and more preferably 1 to 5 mol/mol. If the (SiH group)/(aliphatic unsaturated group) ratio is less than 0.5 mol/mol, no sufficient mechanical strength may be available. If the ratio exceeds 10 mol/mol, cured physical properties may be degraded, especially heat resistance and compression set be substantially degraded.

Differently stated, the organohydrogenpolysiloxane is used in an effective amount to cause the organopolysiloxane (A) to cure, which corresponds to preferably 0.1 to 30 parts, more preferably 0.1 to 10 parts, and even more preferably 0.3 to 10 parts by weight per 100 parts by weight of the organopolysiloxane (A).

The hydrosilylation catalyst is used to induce crosslinking reaction in the addition or hydrosilylation reaction (a). The catalyst promotes addition reaction of aliphatic unsaturated groups (e.g., alkenyl) in component (A) to silicon-bonded hydrogen atoms (i.e., SiH groups) in the organohydrogenpolysiloxane as crosslinker. Suitable hydrosilylation catalysts include platinum group metal based catalysts, typically platinum group metals alone and compounds thereof. Those compounds known as the catalyst for addition-reaction-curable silicone rubber compositions are useful. Examples include microparticulate platinum metal adsorbed to carriers such as silica, alumina and silica gel, platinic chloride, chloroplatinic acid, alcohol solutions of chloroplatinic acid hexahydrate, palladium catalysts, and rhodium catalysts. Inter alia, platinum and platinum compounds are preferred.

The hydrosilylation catalyst may be used in a catalytic amount, that is, an amount sufficient to promote addition reaction. Typically, the catalyst is used in such amounts to provide 1 ppm to 1% by weight, preferably 10 to 500 ppm of platinum group metal based on the weight of component (A). An addition amount of less than 1 ppm may be insufficient to promote addition reaction, leading to under-cure. An amount in excess of 1 wt % may be uneconomical because of no further impact on reactivity.

Besides the catalyst, an addition crosslinking regulator may be added for the purpose of adjusting the cure rate. Suitable regulators are ethynylcyclohexanol and tetramethyltetravinylcyclotetrasiloxane.

Examples of the organic peroxide (b) include benzoyl peroxide, 2,4-dichlorobenzoyl peroxide, p-methylbenzoyl peroxide, o-methylbenzoyl peroxide, 2,4-dicumyl peroxide, 2,5-dimethyl-bis(2,5-t-butylperoxy)hexane, di-t-butyl peroxide, t-butyl perbenzoate, and 1,6-hexanediol bis-t-butylperoxycarbonate.

Preferably, the organic peroxide is used in an amount of 0.1 to 15 parts, more preferably 0.2 to 10 parts by weight per 100 parts by weight of component (A). Outside the range, a less amount of peroxide may fail to drive crosslinking reaction to a full extent, leading to poor physical properties, specifically low hardness, short rubber strength, and increased compression set. An excess amount of peroxide is uneconomical, and decomposition products of the curing agent are generated in more amounts, adversely affecting physical properties (e.g., increased compression set) and promoting discoloring of sheets.

Also, a silane coupling agent may be added as usual for the purpose of improving adhesion to the transparent panel, second panel and backsheet.

The silicone rubber composition may be obtained by weighing predetermined amounts of components (A), (B) and (C) and milling them on a mixer such as a two-roll mill, kneader or Banbury mixer.

The silicone rubber composition thus obtained should preferably have a plasticity of 150 to 1,000, more preferably 200 to 800, and even more preferably 250 to 600, as measured according to JIS K6249. If the plasticity is less than 150, the sheet may become more tacky and less workable and interfere with the subsequent steps of embossing the sheet and separating the embossed sheet. Additionally, it becomes difficult for the embossed silicone rubber sheet to maintain the recess/boss configuration of the embossed structure. If the plasticity exceeds 1,000, then the sheet itself becomes brittle and awkward to emboss.

Any conventional technique such as calendering, injection molding and press molding may be used to shape the silicone rubber composition into sheets. The composition is preferably shaped into silicone rubber sheets having a thickness of 0.3 to 2.0 mm, more preferably 0.3 to 1.0 mm. A sheet with a thickness of less than 0.3 mm may be so soft and susceptible to flaws during the subsequent embossing step whereas a sheet with a thickness of more than 2.0 mm may be difficult to shape by calendering, and uneconomical. In this way, there is obtained a green silicone rubber sheet 10 having a flat surface and pressure-sensitive adhesiveness (FIG. 1).

Next, the step of embossing the green silicone rubber sheet is described. As shown in FIG. 1, the embossing step uses a sheet-form template (sometimes, embossing sheet) 20 having a pattern of recesses and bosses on its surface (embossing surface). The template 20 at its embossing surface is pressed against silicone rubber sheet 10 of the silicone rubber composition defined above for transferring the embossing pattern of template 20 to silicone rubber sheet 10. Preferably, silicone rubber sheet 10 is sandwiched between two templates 20, whereby opposite surfaces of silicone rubber sheet 10 are embossed at a time. A conventional press means, typically a rubber roller may be used in pressing template 20 against silicone rubber sheet 10. At the end of embossing, templates 20 function as protective sheets for both the embossed surfaces of silicone rubber sheet 11 (i.e., double-side embossed sheet).

Hereinafter, reference is made to the embodiment wherein opposite surfaces of a silicone rubber sheet are embossed.

The embossing step may be carried out at room temperature. A higher temperature may promote vulcanization of the rubber sheet composition whereas a lower temperature may interfere with transfer of the embossing pattern. Typically the embossing step is room temperature working without a need for heater.

The material of which template 20 is made is not particularly limited as long as it is readily separated from the silicone rubber sheet. For example, an embossing sheet of polyethylene may be used. The template 20 preferably has a thickness of 0.08 to 0.3 mm. If the thickness is less than 0.08 mm, the embossing pattern may be collapsed when template 20 is pressed against silicone rubber sheet 10. If the thickness is more than 0.3 mm, the cost may be increased. Although the embossing pattern on the template 20 is not particularly limited, the embossing pattern or surface of template 20 preferably includes bosses 21a which are linearly connected to define an oblique lattice as viewed in the plan view of FIG. 2(*a*), and specifically, consists of rhombic units of recesses 21b and bosses 21a. This design is intended for quick release of air bubbles when the embossed silicone rubber sheet 11 is laminated to a panel or the like and further subjected to vacuum lamination to be described later. Specifically, in the subsequent step of embossing the silicone rubber sheet 11, the bosses 21a on the embossing surface of template 20 are transferred to silicone rubber sheet 11 to form interconnected recesses 11b (FIG. 3); and the interconnected recesses 11b define passages for air bubbles to escape. Upon vacuum pumping, the interconnected recesses 11b define passages for air to escape. This ensures quick discharge of air from the spaces between sheet 11 and solar cell matrix 14 and between sheet 11 and transparent panel 13a (or second panel or backsheet 13b), preventing pore formation. The gas evacuated by vacuum pumping encompasses overall outgoing gases including not only air, but water vapor in air, low-molecular-weight siloxane gases and water vapor generated from the green silicone rubber sheet. Reference is made to air as typical of these gases. If deaeration is insufficient, unbonded portions or pores due to air bubbles are formed between the solar cell matrix and the green silicone rubber sheet. Then the seal around the solar cell matrix is insufficient, allowing ingress of water vapor through pores during outdoor exposure (service) of the solar cell module. Then electrodes of solar cells can be corroded, and the solar cell module loses long-term reliability.

The embossing pattern (or recess/boss pattern) on template 20 is not particularly limited as long as recesses 11b formed in the silicone rubber sheet 11 by embossing define air passages. Exemplary patterns include a diamond pattern of interconnected rhombic embossing units, a lattice pattern of interconnected rectangular embossing units, a network pattern of interconnected circular embossing units, a hexagonal pattern of interconnected hexagonal units, a wave pattern of interconnected corrugated embossing units, and an irregular pattern of interconnected closed linear embossing units. Also useful is a pattern of square or rectangular bosses or recesses defined by lattice-like grooves and delineated by four side grooves. Further a pattern of square or rectangular regions each provided with a cylindrical or elliptic recess or boss at the center is also acceptable. The shape of recesses and bosses is not particularly limited.

Figure 2A:
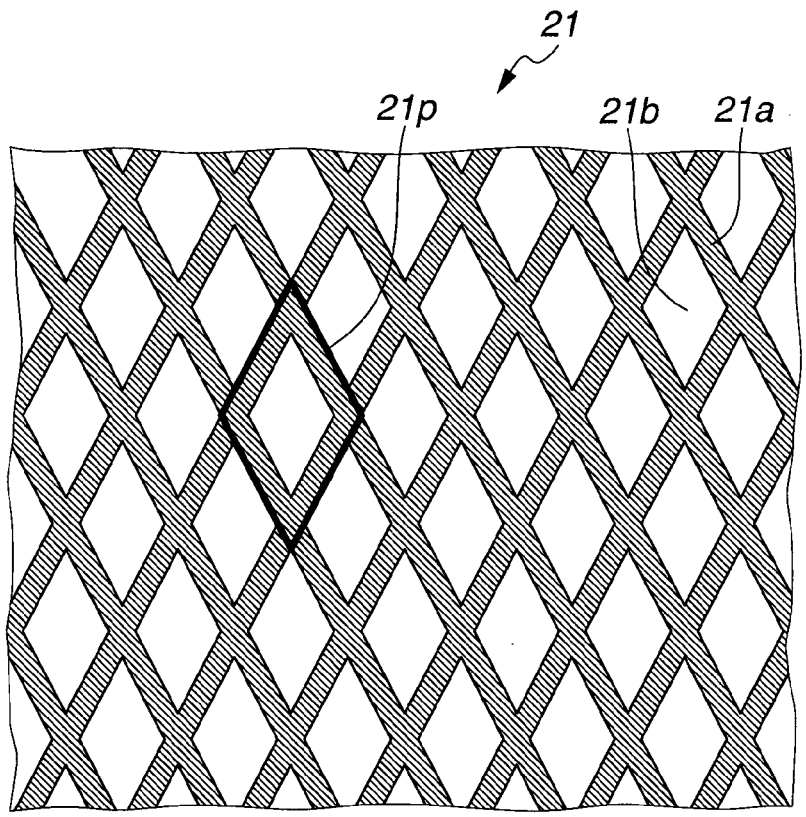
FIGS. 2A and 2B schematically illustrate one exemplary embossing pattern on a template, (a) being a plan view of the pattern and (b) being an enlarged plan view of one embossing unit.
Figure 2B:
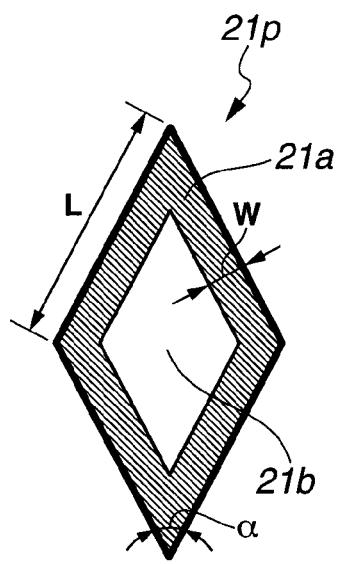

Reference is now made to the diamond shaped embossing pattern 21 in FIG. 2 as a typical embossing pattern on the embossing surface of template 20. FIG. 2(a) is a plan view showing an entire diamond shaped embossing pattern, and FIG. 2(b) is an enlarged plan view of one embossing unit to constitute the pattern of FIG. 2(a). In the diamond shaped embossing pattern, the rhombic embossing unit 21p (in FIG. 2(b)) is delineated by four outer sides preferably having a length L of 2 to 5 mm. If the length L of one side is less than 2 mm, then it may be difficult to accurately transfer the embossing pattern. If the length L of one side exceeds 5 mm, then the embossing pattern may be collapsed when template 20 is pressed against green silicone rubber sheet 10. Additionally, if the length L of one side is less than 2 mm, then bosses 11a formed in silicone rubber sheet 11 as a result of transfer of recesses 21b are smaller, so that the area of lamination to transparent panel 13a, second panel or backsheet 13b may become smaller, leaving a possibility that silicone rubber sheet 11 is separated off depending on the width of bosses 21a. Inversely, if the length L of one side is more than 5 mm, then the area of lamination of silicone rubber sheet 11 is increased, and the area of recesses 11b in silicone rubber sheet 11 is relatively reduced, indicating a risk of insufficient deaeration in the vacuum lamination step. For the same reason, it is preferred that a rectangular embossing unit be delineated by four sides having a length of 2 to 5 mm, and a circular embossing unit be delineated by a circle having a radius of 2 to 5 mm.

For the rhombic embossing unit 21p (in FIG. 2(b)) delineated by four sides, the acute angle α included between two sides is preferably 40 to 70 degrees. If the angle α is less than 40°, then it may be difficult to accurately transfer the embossing pattern to the green silicone rubber sheet. If the angle α is more than 70°, then the embossing pattern may be collapsed when template 20 is pressed against green silicone rubber sheet 10.

The rhombic embossing unit 21p is delineated by a rhombic boss 21a preferably having a width W of 0.2 to 1 mm. If the width W is less than 0.2 mm, then it may be difficult to accurately transfer the boss 21a to the green silicone rubber sheet. If the width W is more than 1 mm, then it may be difficult to accurately transfer the recess 21b to the green silicone rubber sheet. For the same reason, it is preferred that a rectangular or circular embossing unit be delineated by a boss having a width of 0.2 to 1 mm.

The boss 21a of the rhombic embossing unit 21p preferably has a height of 0.1 to 0.5 mm. Note that the height of boss 21a is equal to the depth of recess 21b. If the boss height is less than 0.1 mm, then the height of boss 11a embossed in silicone rubber sheet 11 is too less, failing to gain a passage for air upon vacuum pumping in the vacuum lamination step. If the boss height is more than 0.5 mm, then the boss 11a in silicone rubber sheet 11 becomes so high that the space between the sheet and the adjacent subject (solar cell matrix, transparent panel, second panel or backsheet) may not be readily filled even when they are compressed during the vacuum lamination step. For the same reason, it is preferred that a rectangular or circular embossing unit be delineated by a boss having a height of 0.1 to 0.5 mm.

After the embossing surface of template 20 is pressed against green silicone rubber sheet 10, the template 20 is separated therefrom. There is obtained a silicone rubber sheet 11 having a recess/boss pattern (FIG. 3(a)) which is a substantial reversal of the recess/boss pattern on the embossing surface of template 20. That is, silicone rubber sheet 11 has recesses 11b which correspond to the shape and size of bosses 21a on template 20, and bosses 11a which correspond to the shape and size of recesses 21b on template 20.

(ii) Lamination of Silicone Rubber Sheet (FIG. 3)

In this step, one of the embossed silicone rubber sheets is laminated to one surface of the transparent panel such that the embossed surface is disposed remote from the transparent panel, and the other embossed silicone rubber sheet is laminated to one surface of the second panel or backsheet such that the embossed surface is disposed remote from the second panel or backsheet.

That is, as shown in FIG. 3, the template 20 is separated from one of the embossed surfaces of silicone rubber sheet 11 (FIG. 3(a)), the bare surface of silicone rubber sheet 11 (bosses 11a of embossed structure) is brought in light contact with transparent panel 13a (or second panel or backsheet 13b), and the bare surface is laminated to transparent panel 13a (or second panel or backsheet 13b) such that recesses (recesses 11b of embossed structure) may not be collapsed (FIG. 3(b)).

At this point, the transparent panel is a transparent member presenting an incident surface for sunlight (light receiving surface) and is also referred to as light-receiving side panel. A member having transparency, weather resistance, and impact resistance as well as long-term reliability during outdoor service is necessary. For example, plates of strengthened colorless glass, acrylic resin, fluoro-resin or polycarbonate resin are suitable, with strengthened colorless glass plates having a thickness of about 3 to 5 mm being preferred.

The second panel or backsheet is disposed and opposed to the transparent panel. The second panel must meet efficient heat dissipation from solar cell components and may be made of glass materials, synthetic resins, metal materials or composite materials thereof. Suitable glass materials include soda lime glass, colorless glass, and strengthened glass. Suitable synthetic resins include acrylic resins, polycarbonate (PC) resins, polyethylene terephthalate (PET) resins, and epoxy resins. Suitable metal materials include copper, aluminum and iron. Suitable composite materials include synthetic resins loaded with a high heat conductivity filler such as titania, alumina or aluminum nitride. When the second panel is disposed remote from the sunlight incident surface, the second panel is preferably a transparent member like the panel on sunlight incident side. Then parts of incident sunlight and scattering light may be transmitted to the remote side. Then in an example where the solar cell module is installed in a grassland, part of sunlight reaches the area of the land which is disposed below and shaded by the module, so that plants can grow even in the otherwise shaded area. This is convenient in that the module-installed region can also be utilized for pasturage.

The backsheet may be selected from fluoro-resin films such as ethylene-tetrafluoroethylene (ETFE) copolymer films or polyvinyl fluoride (PVF) films, or laminated sheets such as aluminum foil or PET sandwiched between PVF sheets.

One exemplary method of laminating the silicone rubber sheet is by separating one of templates 20 which remain pressed to the opposite surfaces of embossed silicone rubber sheet 11 resulting from step (i) (FIG. 3(a)), bringing the bare surface of silicone rubber sheet 11 in contact with transparent panel 13a, and pressing them by a rubber roller or the like for thereby laminating silicone rubber sheet 11 to transparent panel 13a (FIG. 3(b)). At this point, when rubber sheet 11 is laminated to transparent panel 13a, bosses 11a of the embossed pattern on the silicone rubber sheet 11 are abutted against panel 13a and somewhat flattened, but recesses 11b (grooves in the embossed surface) may not be collapsed. If recesses 11b (grooves in the embossed surface) are collapsed, air bubbles may not find a way to escape during the subsequent vacuum lamination step. Similarly, the other silicone rubber sheet 11 is laminated to the second panel or backsheet 13b which is to be opposed to the transparent panel.

(iii) Vacuum Lamination Step

Next, template 20 is separated from the opposite side of silicone rubber sheet 11, a solar cell matrix 12 is rested on silicone rubber sheet 11 on transparent panel 13a or second panel or backsheet 13b, and transparent panel 13a is superposed on second panel or backsheet 13b with the silicone rubber sheets 11 inside as shown in FIG. 4. That is, the transparent panel 13a, embossed silicone rubber sheet (double side embossed sheet) 11, solar cell matrix 14, embossed silicone rubber sheet 11, and backsheet 13b are stacked in the described order. At this point, silicone rubber sheets 11 are disposed so as to cover the entire solar cell matrix 14.

It is noted that when only one surface of a silicone rubber sheet is embossed, the silicone rubber sheet is disposed with its embossed surface faced toward the solar cell matrix.

Using a vacuum laminator (or module laminator), the multilayer assembly of solar cell module components is pressed and heated in vacuum to cure the silicone rubber sheets, for thereby establishing a seal around the solar cell matrix.

The solar or photovoltaic cell components are formed using a silicon material (or silicon substrate) selected from monocrystalline silicon and multicrystalline silicon or both. The solar cell matrix 14 is constructed by arranging a plurality of solar cell components in columns and rows and electrically connecting them. Typically, the solar cell matrix 14 is constructed by electrically connecting solar cell components in series via interconnectors such as tab wires to form a solar cell string, arranging a plurality of such strings in parallel and electrically connecting the strings in series. Typically, the solar cell matrix 14 is composed of 2 to 60 solar cell components. Where the solar cell component is of bifacial light receiving type, not only panel 13a, but also second panel or backsheet 13b opposed to panel 13a are transparent.

The vacuum laminator used herein may be a laminator comprising two adjacent vacuum tanks partitioned by a flexible membrane, as commonly used in the manufacture of solar cell modules.

Figure 5:
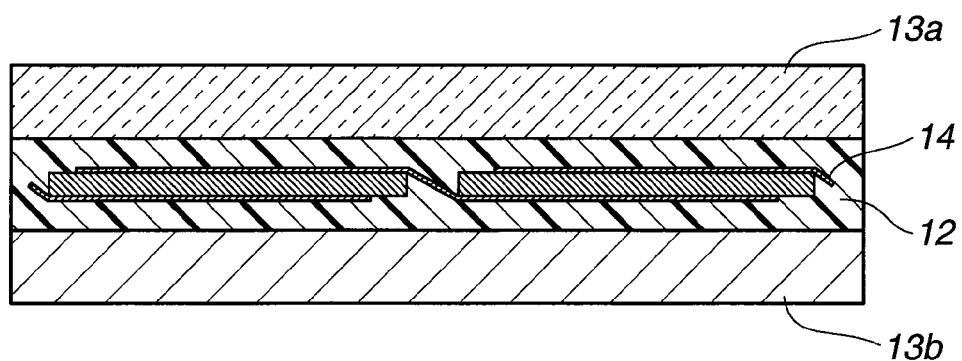
FIG. 5 is a cross-sectional view of the resin-encapsulated solar cell matrix resulting from the laminating step by a vacuum laminator in the method for manufacturing a solar cell module according to the first embodiment of the invention.

For example, the precursory assembly of solar module components including panels 13a and backsheet 13b as shown in FIG. 4 is set in one tank, two tanks are pumped until a substantial vacuum is established. At this point, since the green silicone rubber sheets are pressure-sensitive adhesive, if flat green silicone rubber sheets as such are stacked into a precursory assembly as above, the green silicone rubber sheets partially bond to the solar cell matrix and to each other to block air passages during vacuum pumping. Air remaining there without being discharged is left as air bubbles, generating unbonded regions or pores. The gas discharged by vacuum pumping covers overall gases including not only air, but also water vapor in air, low-molecular-weight siloxane gases and water vapor released from the green silicone rubber sheets. Air is described as a typical gas as alluded to previously. If unbonded regions are generated, the sealing of the solar cell matrix becomes insufficient, allowing for ingress of water vapor into the solar cell module during outdoor exposure, which causes corrosion of cell electrodes and detracts from long-term reliability. While the solar cell module is typically constructed as a large panel of about 1.6 m long and about 1 m wide, the module is not completed if several unbonded regions or pores are formed therein as a result of air bubbles. The generation of such pores imposes a serious problem to the manufacture process. According to the invention, during vacuum pumping of the vacuum laminator, gas (air) in the spaces between transparent panel 13a and silicone rubber sheet 11, between solar cell matrix 14 and silicone rubber sheet 11, and between silicone rubber sheet 11 and backsheet 13b can be removed or evacuated through channels defined by embossed recesses 11b. At this point, the degree of reduced pressure or vacuum is such that interstices between layers may be fully buried rather than being left as air bubbles during compression. Next, while the one tank having set therein the precursory assembly of solar cell module components including transparent panel 13a and backsheet 13b is kept in vacuum, the other tank is released to atmospheric pressure or even kept under an applied pressure, whereby transparent panel 13a and backsheet 13b are compressed in their thickness direction by the membrane. At this point, the interstices between layers are closely filled with silicone rubber because of full evacuation between layers. In this step, transparent panel 13a and backsheet 13b are heated at 70 to 150° C., preferably 90 to 130° C., and more preferably 110 to 120° C., and compressed at the temperature for 1 to 30 minutes. Then two green silicone rubber sheets 11 are fused together, cured and fixedly bonded to solar cell matrix 14, transparent panel 13a, and backsheet 13b. That is, solar cell matrix 14 is encapsulated with an encapsulant 12, which is a cured product of the silicone rubber composition, between transparent panel 13a and backsheet 13b, as shown in FIG. 5. The encapsulant 12 establishes a seal, preventing the ingress of moisture and gas into the solar cell module from its edge faces. The resulting solar cell module is thus of fully durable performance.

If the heating temperature is lower than 70° C., vulcanization reaction of silicone rubber sheets 11 may not proceed to completion. If the heating temperature is higher than 150° C., the vulcanization reaction rate may become so high that silicone rubber sheets 11 may prematurely cure, failing to establish a complete seal and leaving gaps between transparent panel 13a and backsheet 13b.

Finally, a frame member is mounted on the outer periphery of the transparent panel and second panel or backsheet as press bonded, completing a solar cell module.

The frame member is preferably made of aluminum alloy, stainless steel or similar material having strength against shocks, wind pressure or snow deposition, weather resistance, and lightweight. The frame member of such material is mounted so as to enclose the outer periphery of the assembly of panels having the solar cell matrix sandwiched therebetween and fixedly secured to the panels by screws (not shown).

The solar cell module thus constructed is characterized by high efficiency and long-term reliability since the solar cell matrix is held by the flat transparent panel and the second panel or backsheet via cured silicone rubber. According to the inventive method, solar cell modules of consistent performance can be easily manufactured in a large scale.

Second Embodiment

In the second embodiment of the method for manufacturing a solar cell module, step (1) includes laminating a green silicone rubber sheet of the silicone rubber composition to one surface of a transparent panel and embossing the surface of the green silicone rubber sheet laminated to the transparent panel; and step (2) includes laminating a green silicone rubber sheet of the silicone rubber composition to one surface of the second panel or backsheet and embossing the surface of the green silicone rubber sheet laminated to the second panel or backsheet.

The steps in the second embodiment are described in detail. It is noted that the silicone rubber sheet 10, transparent panel 13a, and second panel or backsheet 13 used in the second embodiment are the same as in the first embodiment.

Step (1-i): Lamination of Silicone Rubber Sheet (FIG. 6)

In this step (1-i), first a silicone rubber sheet 10, i.e., a green (pressure-sensitive adhesive) silicone rubber sheet of the millable silicone rubber composition is prepared. Using a laminator (glass laminator 30) including rollers for compression bonding as shown in FIG. 6, the green silicone rubber sheet is laminated to a transparent panel 13a.

Figure 6:
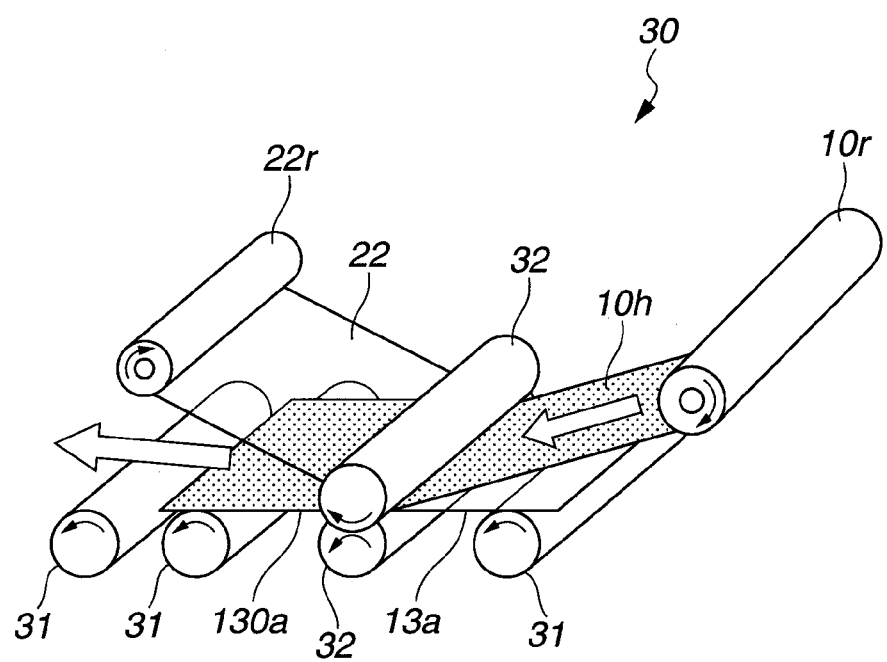
FIG. 6 is a perspective view of a glass laminator used in the method for manufacturing a solar cell module according to a second embodiment of the invention.

As shown in FIG. 6, the glass laminator 30 includes a feed mechanism for feeding a transparent panel 13a with feed rollers 31 while supporting it horizontal; a sheet supply mechanism for unwinding a silicone rubber sheet 10h covered with a protective film 22 from a silicone rubber sheet roll 10r and feeding it between pressure rollers 32; a pair of pressure rollers 32 of urethane or silicone rubber for press bonding transparent panel 13a and silicone rubber sheet 10 together; and a takeup mechanism disposed at the outlet side of pressure rollers 32 for peeling protective film 22 from silicone rubber sheet 10 and winding it into a film roll 22r. In FIG. 6, the input side is depicted at the right, the output side is depicted at the left, and the arrows indicate rotating directions of rollers and rolls.

Since the silicone rubber sheet 10 corresponds to the dimensions (e.g., about 1.6 m long by about 1 m wide) of the solar cell module and has pressure-sensitive adhesiveness, it is difficult to handle the silicone rubber sheet 10 as such. Thus, preferably a protective film 22 is applied to one surface or both surfaces of silicone rubber sheet 10 so that the sheet may be easy to handle. Any film may be used as the protective film 22 as long as it causes neither flaw nor stain to silicone rubber sheet 10, maintains pressure-sensitive adhesiveness, and can be readily peeled from silicone rubber sheet 10. Included are, for example, films made of polyethylene or polyesters as typified by polyethylene terephthalate (PET) which are flat (not embossed) and flexible as well as embossed films obtained by embossing such flat films with an embossing pattern as shown in FIG. 2(a). In the illustrated embodiment, a silicone rubber sheet roll 10r obtained by applying a protective film 22 to one surface of a silicone rubber sheet 10 and winding it into a roll is provided as the starting material for the step.

The present step is conducted as follows, using the glass laminator 30 shown in FIG. 6. The feed rollers 31 are operated to feed the transparent panel 13a from right to left in the figure. At the same time, the silicone rubber sheet 10h covered with protective film 22 is unwound from the silicone rubber sheet roll 10r disposed at the inlet and upper side of the system such that the protective film 22-bearing surface of the silicone rubber sheet 10h may face upward and the bare surface thereof may face downward, and fed on top of the transparent panel 13a. Next, the transparent panel 13a and the protective film 22-bearing silicone rubber sheet 10h in a superposed manner are inserted between pressure rollers 32, 32. Through pressure rollers 32, 32, the transparent panel 13a and the protective film 22-bearing silicone rubber sheet 10h are press bonded together into a laminate. At this point, the pressure rollers 32 are not heated, that is, lamination is performed at room temperature. At the outlet side of the pressure rollers 32, the protective film 22 is peeled from the laminate and taken up as a protective film roll 22r. There is obtained a laminate 130a consisting of transparent panel 13a and silicone rubber sheet 10 bonded thereto. In this laminate 130a, transparent panel 13a and silicone rubber sheet 10 are tightly bonded in close contact without leaving voids, i.e., without trapping air bubbles.

It is noted that the lamination treatment may be performed under atmospheric pressure, but preferably under reduced pressure because the reduced pressure achieved by differential pumping is effective for preventing air bubbles from being trapped between transparent panel 13a and silicone rubber sheet 10. In case panels are of small size, a laminate 130a may be manufactured by manually superposing silicone rubber sheet 10h on transparent panel 13a, inserting them between pressure rollers 32, 32 (driven for rotation) for thereby laminating them together, and peeling protective sheet 22 therefrom.

Step (1-ii): Embossing (FIG. 7)

Figure 7:
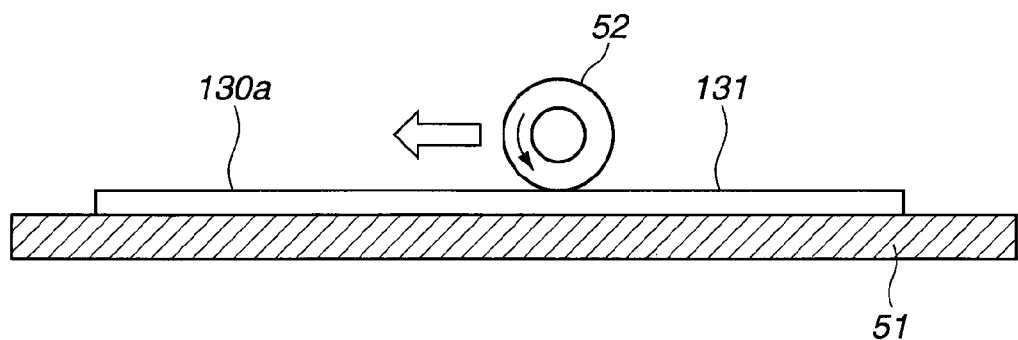
FIG. 7 illustrates in cross section the step of embossing the surface of a silicone rubber sheet laminated to a transparent panel.

In this step, as shown in FIG. 7, the surface of silicone rubber sheet 10 of the laminate 130a thus obtained is subjected to embossing work. Depicted in FIG. 7 are a flat platen 51 and an embossing roller 52 which is a roller-shaped template.

The embossing roller 52 is preferably made of a metal material such as stainless steel or a rigid plastic material such as polyethylene or polyether ether ketone (PEEK) and more preferably such a material which is readily separable from silicone rubber sheets. The embossing roller 52 is provided on its outer circumferential surface with an embossing pattern (or a pattern of recesses and bosses) as in the first embodiment.

In FIG. 7, first the laminate 130a is rested on the flat platen 51, with the silicone rubber sheet 10 facing upward. The embossing roller 52 at its circumferential surface is forced onto the surface of silicone rubber sheet 10 and rotationally moved, for thereby transferring the embossing pattern (or a pattern of recesses and bosses) to the surface of silicone rubber sheet 10. The entire one surface of silicone rubber sheet 10 is thus endowed with the predetermined pattern of recesses and bosses. There is obtained a first laminate 131 in which silicone rubber sheet 11' having the predetermined pattern of recesses and bosses is laminated to one surface of transparent panel 13a.

It is noted that the embossing step is not limited to the illustrated method. For example, as described for the first embodiment, a template 20 may be pressed against silicone rubber sheet 10 of laminate 130a for transferring the embossing pattern thereto.

Step (2-i): Lamination of Silicone Rubber Sheet (FIG. 8)

In this step, first a silicone rubber sheet 10, that is, a green silicone rubber sheet of the millable silicone composition having pressure-sensitive adhesiveness is prepared. Using a laminator having pressure rollers, i.e., film laminator 40 shown in FIG. 8, the green silicone rubber sheet is laminated to a backsheet 13b.

Figure 8:
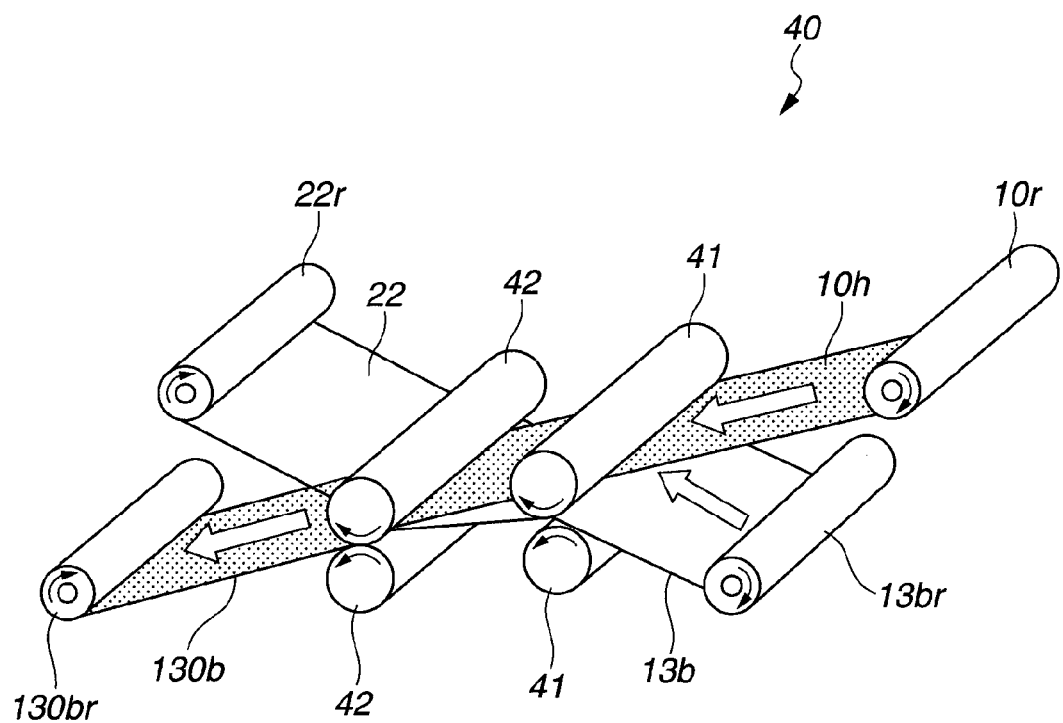
FIG. 8 is a perspective view of a film laminator used in the method for manufacturing a solar cell module according to the second embodiment of the invention.

As shown in FIG. 8, the film laminator 40 includes a first sheet feed mechanism for unwinding a backsheet 13b from a backsheet roll 13br and feeding it toward pressure rollers 42 while supporting it with a lower support roller 41; a second sheet feed mechanism for unwinding a silicone rubber sheet 10h covered with a protective film 22 from a silicone rubber sheet roll 10r and feeding it toward pressure rollers 42 while supporting it with an upper support roller 41; a pair of pressure rollers 42 of urethane or silicone rubber for press bonding the backsheet 13b and the silicone rubber sheet 10 together for lamination; and a takeup mechanism disposed at the outlet side of pressure rollers 42 for peeling the protective film 22 from the silicone rubber sheet 10 and winding it into a film roll 22r. In FIG. 8, the input side is depicted at the right, the output side is depicted at the left, and the arrows indicate rotating directions of rollers and rolls.

The present step using the film laminator 40 shown in FIG. 8 is conducted as follows. First, the backsheet 13b is unwound from the backsheet roll 13br disposed at the inlet and lower side of the system and fed forward by the first sheet feed mechanism. At the same time, the silicone rubber sheet 10h covered with protective film 22 is unwound from the silicone rubber sheet roll 10r disposed at the inlet and upper side of the system such that the protective film 22-bearing surface of the silicone rubber sheet 10h may face upward and the bare surface thereof may face downward, and fed on top of the backsheet 13b. Next, the backsheet 13b and the protective film 22-bearing silicone rubber sheet 10h superposed thereon are inserted between pressure rollers 42, 42. Through pressure rollers 42, 42, the backsheet 13b and the protective film 22-bearing silicone rubber sheet 10h are press bonded together into a laminate. At this point, the pressure rollers 42 are not heated, that is, lamination is performed at room temperature. At the outlet side of the pressure rollers 42, the protective film 22 is peeled from the laminate and wound up as a protective film roll 22r. There is obtained a laminate 130b consisting of backsheet 13b and silicone rubber sheet 10 bonded thereto. In this laminate 130b, backsheet 13b and silicone rubber sheet 10 are tightly bonded in close contact without leaving voids, i.e., without trapping air bubbles.

When the portions of backsheet 13b and silicone rubber sheet 10h are press bonded between pressure rollers 42, 42, it is preferred that backsheet 13b and silicone rubber sheet 10h are fed such that cross-sections of backsheet 13b and silicone rubber sheet 10h, taken perpendicular to the pressure bonding direction, may travel at an equal speed while backward tensions are applied to backsheet 13b and silicone rubber sheet 10h toward backsheet roll 13br and silicone rubber sheet roll 10r. Then backsheet 13b and silicone rubber sheet 10 are tightly laminated in close contact without leaving voids, i.e., without trapping air bubbles.

It is noted that the lamination treatment may be performed under atmospheric pressure, but preferably under reduced pressure because the reduced pressure achieved by differential pumping is effective for preventing air bubbles from being trapped between backsheet 13b and silicone rubber sheet 10.

Step (2-ii): Embossing (FIG. 9)

Figure 9:
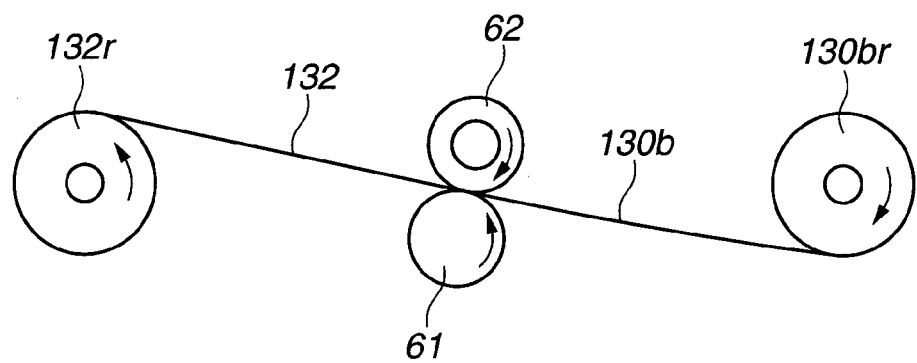
FIG. 9 illustrates in cross section the step of embossing the surface of a silicone rubber sheet laminated to a backsheet.

In this step, as shown in FIG. 9, the surface of silicone rubber sheet 10 of the laminate 130b thus obtained is subjected to embossing work. Depicted in FIG. 9 are a support roller 61 and an embossing roller 62 which is a roller-shaped template. The embossing roller 62 may be the same as the embossing roller 52 in the previous embodiment, but is disposed at a fixed position to mate with the support roller 61 to sandwich the laminate 130b therebetween for thereby pressing the laminate 130b.

In FIG. 9, first the laminate 130b is unwound from the laminate roll 130br disposed at the right side in the figure, with the silicone rubber sheet 10 facing upward, and fed between the embossing roller 62 and support roller 61. While the embossing roller 62 rotates at a circumferential speed equal to the travel speed of the laminate 130b, the circumferential surface of the embossing roller 62 is forced against the surface of silicone rubber sheet 10 of laminate 130b for thereby transferring the embossing pattern (pattern of recesses and bosses) to the surface of silicone rubber sheet 10. The entire one surface of silicone rubber sheet 10 is thus endowed with the predetermined pattern of recesses and bosses. There is obtained a second laminate 132 in which silicone rubber sheet 11' having the predetermined pattern of recesses and bosses is laminated to one surface of backsheet 13b. In this embodiment, the second laminate 132 is taken up into a second laminate roll 132r, from which the second laminate 132 in the form of a sheet-like piece of predetermined dimensions is cut out for the subsequent step of vacuum lamination.

In case panels are of small size, a laminate 132 may be manufactured by manually inserting the laminate 130b between support roller 61 and embossing roller 62 (both driven for rotation) for thereby embossing the silicone rubber sheet 10 of the laminate.

Although the illustrated embodiment refers to continuous treatment of a length of backsheet unwound from its roll, the invention is not limited thereto. For example, cut pieces of backsheet or panel may be treated. In this case, the treatment may be the same as the above treatment of transparent panel 13a, i.e., Steps (1-i) and (1-ii).

Step (3): Vacuum Lamination

Figure 10:
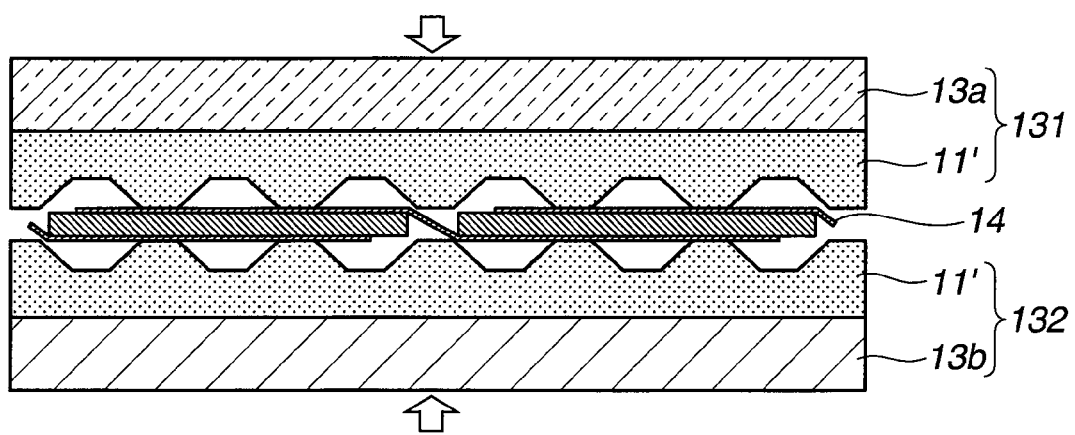
FIG. 10 is a cross-sectional view of an exemplary multilayer arrangement of solar cell module components in the method for manufacturing a solar cell module according to the second embodiment of the invention.

As shown in FIG. 10, the first and second laminates 131 and 132 obtained above are placed with the embossed surfaces of silicone rubber sheets 11' facing each other, while a solar cell matrix 14 is interposed therebetween. There is available a precursory assembly including transparent panel 13a, embossed silicone rubber sheet (one side embossed sheet) 11', solar cell matrix 14, embossed silicone rubber sheet 11', and backsheet 13b arranged from top to bottom in the described order.

Using a vacuum laminator as in the first embodiment, the layer assembly of stacked solar module components is heated in vacuum and compressed, for curing the silicone rubber sheets for establishing a seal around the solar cell matrix.

More specifically, the precursory assembly of solar module components including transparent panel 13a and backsheet 13b as shown in FIG. 10 is set in one tank, and two tanks are pumped until a substantial vacuum is established. During vacuum pumping of the vacuum laminator, gas (air) in the spaces between silicone rubber sheet 11' on transparent panel 13a and solar cell matrix 14, and between solar cell matrix 14 and silicone rubber sheet 11' on backsheet 13b can be passed and evacuated through channels defined by embossed recesses 11b on silicone rubber sheets 11'. Next, while the one tank having set therein the precursory assembly of solar cell module components including transparent panel 13a and backsheet 13b is kept in vacuum, the other tank is released to atmospheric pressure or even kept under an applied pressure, whereby transparent panel 13a and backsheet 13b are compressed in their thickness direction by the membrane. At this point, any spaces between layers are closely filled with silicone rubber because of full evacuation between layers. The transparent panel 13a and silicone rubber sheet 11' and the backsheet 13b and silicone rubber sheet 11' are tightly contiguous because they have been set in close contact by the above lamination steps. At this point, transparent panel 13a and backsheet 13b are heated at a temperature of 70 to 150° C., preferably 90 to 130° C., and more preferably 110 to 120° C., and compressed at the temperature for 1 to 30 minutes. Then two green silicone rubber sheets 11' are fused together, cured and fixedly bonded to solar cell matrix 14, transparent panel 13a, and backsheet 13b. That is, solar cell matrix 14 is encapsulated with an encapsulant 12, which is a cured product of the silicone rubber composition, between transparent panel 13a and backsheet 13b, as shown in FIG. 5. The encapsulant 12 establishes a seal, preventing the ingress of moisture and gas into the solar cell module from its edge faces. The resulting solar cell module is thus of fully durable performance.

Finally, a frame member is mounted on the outer periphery of the transparent panel and second panel or backsheet as press bonded, completing a solar cell module.

The solar cell module thus constructed is characterized by high efficiency and long-term reliability since the solar cell matrix is held by the flat transparent panel and second panel or backsheet via cured silicone rubber. According to the inventive method, solar cell modules of consistent performance can be easily manufactured in a large scale.

EXAMPLE

Examples of the invention are given below by way of illustration and not by way of limitation. All parts are by weight. Room temperature (RT) is 25° C. A weight average degree of polymerization (DOP) is measured by gel permeation chromatography (GPC) versus polystyrene standards.

Example 1

A solar cell module was manufactured as follows.

First, 100 parts of an organopolysiloxane consisting of 99.825 mol % of dimethylsiloxane units, 0.15 mol % of methylvinylsiloxane units, and 0.025 mol % of dimethylvinylsiloxane units and having an average DOP of ~8,000 was milled with 80 parts of dry silica having a BET surface area of 200 $m^2/g$ (Aerosil 200 by Nippon Aerosil Co., Ltd.) and 5 parts of dimethylpolysiloxane having a silanol group at both ends and a viscosity of 29 mPa·s at 25° C. on a kneader, and heat treated at 180° C. for 2 hours, yielding a base rubber compound.

To the base rubber compound, 0.5 part of platinum catalyst C-25A and 2.0 parts of organohydrogenpolysiloxane C-25B, both available from Shin-Etsu Chemical Co., Ltd., were added as addition curing agent. The mixture was milled on a two-roll mill to form a silicone rubber sheet of 5 mm thick. The resulting silicone rubber composition had a plasticity of 430 as measured according to JIS K6249.

Using a calendering machine (Nippon Roll Co., Ltd.), the silicone rubber sheet of 5 mm thick was calendered at RT into a silicone rubber sheet of 1 mm thick. Using a rubber roller, sheet-form templates having a diamond-shaped embossing pattern as shown in FIG. 2, i.e., diamond embossing films (Ishijima Chemical Industries Co., Ltd., Emboss NEF type, thickness 0.15 mm) at their embossing surface were pressed to opposite surfaces of the silicone rubber sheet at RT, thereby embossing the opposite surfaces of the silicone rubber sheet (referred to as "double-side embossed sheet" hereinafter). In this way, two double-side embossed sheets were obtained. The template included embossing units 21*p* delineated by four side bosses 21*a* having an outer length L of 3.2 mm and a width W of 0.45 mm, defining an acute angle α of 56°.

The template (embossing film) was peeled from one surface of one double-side embossed sheet, the embossed surface of the sheet was placed in abutment with a strengthened colorless glass plate of 340 mm×360 mm×3.2 mm thick (referred to as glass plate, hereinafter). Using a rubber roller, the double-side embossed sheet was laminated to the glass plate such that the recesses on the double-side embossed sheet might not be collapsed.

Further, to judge the seal state on the back side, a monolayer transparent PET film (0.25 mm thick) was used as backsheet. As above, the embossed surface of the other double-side embossed sheet, from which the template (or embossing film) had been peeled, was placed in abutment with one surface of the PET film. Using a rubber roller, the double-side embossed sheet was laminated to the PET film such that the recesses on the double-side embossed sheet might not be collapsed.

Figure 11:
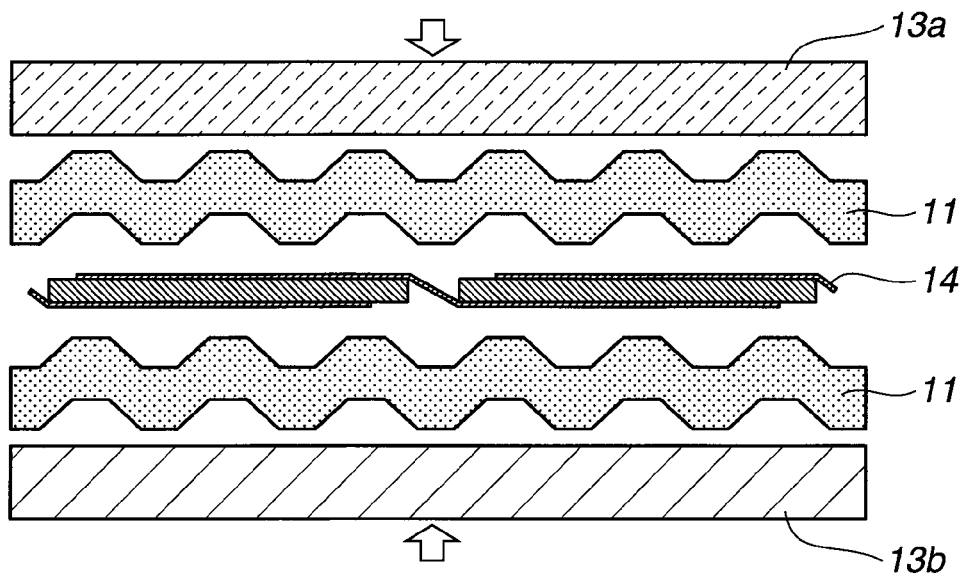
FIG. 11 is a cross-sectional view of a multilayer arrangement of solar cell module components in Example 1.

Next, solar cell module components were stacked as shown in FIG. 11. Specifically, the template (embossing film) was peeled from the other surface of the double-side embossed sheet laminated to the glass plate. A 2/2 series solar cell matrix, which was constructed by arranging monocrystalline silicon solar cell components in a matrix of 2 rows and 2 columns and electrically connecting them in series, was rested thereon. The template (embossing film) was peeled from the other surface of the other double-side embossed sheet laminated to the backsheet. The other double-side embossed sheet with its bare surface (embossing surface) faced downward was rested on the solar cell matrix.

The multilayer assembly as shown in FIG. 11 was set in a vacuum laminator. Once a vacuum was established, the assembly was heated at 110° C. for 15 minutes and the components were compression bonded under atmospheric pressure, completing a solar cell module A.

Comparative Example 1

Figure 12:
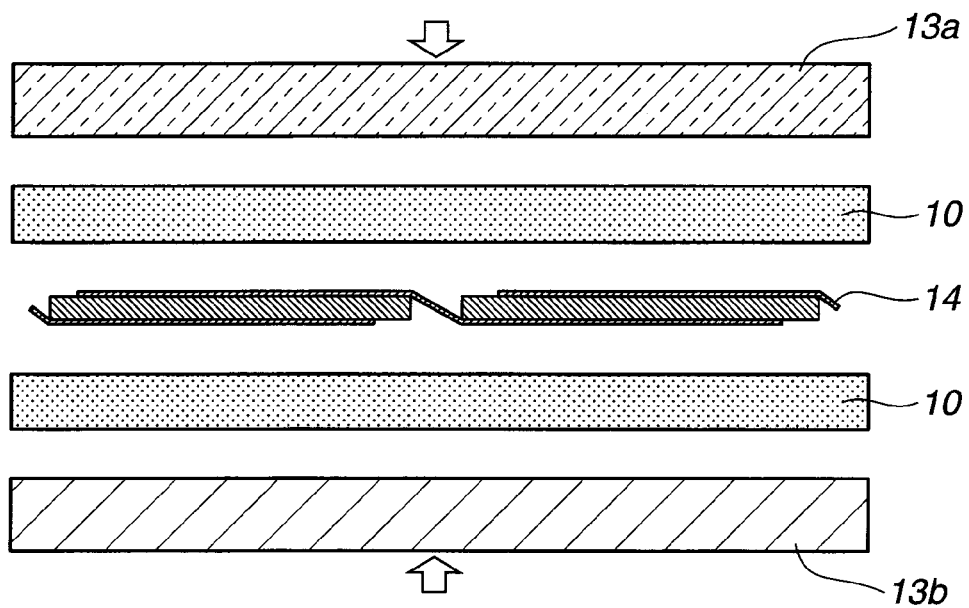
FIG. 12 is a cross-sectional view of a multilayer arrangement of solar cell module components in Comparative Example 1.

The procedure of Example 1 was repeated except that neither surfaces of two silicone rubber sheets were subjected to embossing treatment. That is, flat silicone rubber sheets were used. A solar cell module B was manufactured. FIG. 12 shows the multilayer arrangement of solar cell module components prior to vacuum lamination.

Comparative Example 2

As in Example 1, a silicone rubber composition was prepared aside from using 160 parts of Aerosil 200 in the base rubber compound. A silicone rubber sheet of 5 mm thick was prepared therefrom. The silicone rubber sheet of 5 mm thick was brittle, so that an attempt to calender the sheet of 5 mm thick at RT into a sheet of 1 mm thick using a calendering machine (Nippon Roll Co., Ltd.) failed. The process was no longer followed.

Reference Example 1

Figure 13:
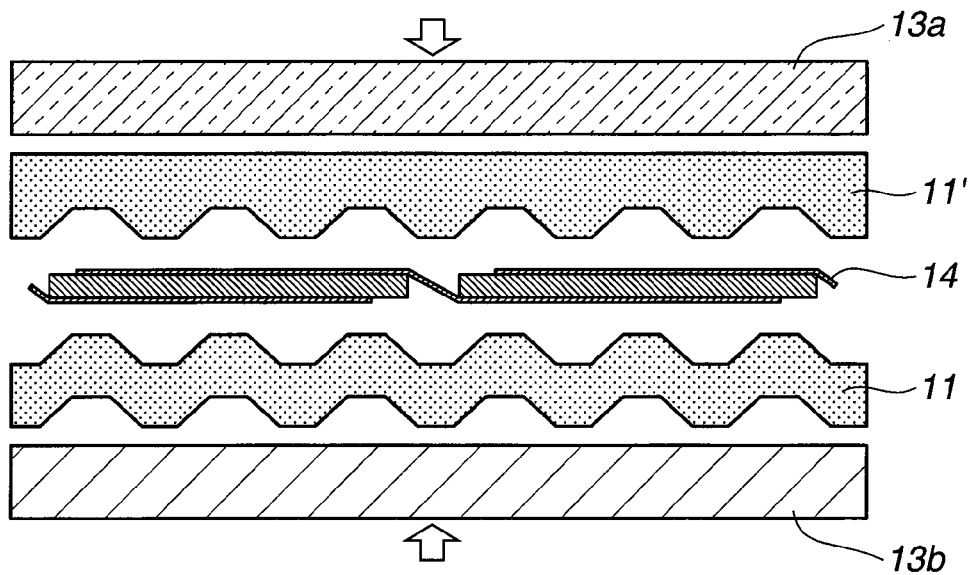
FIG. 13 is a cross-sectional view of a multilayer arrangement of solar cell module components in Reference Example 1.

A solar cell module C was manufactured as in Example 1 except the following changes. One of two silicone rubber sheets in Example 1 was embossed as in Example 1, but on one surface. The embossing treatment on the other surface was omitted, i.e., the other surface was kept flat. This silicone rubber sheet is referred to as "one-side embossed sheet." The other silicone rubber sheet was a double-side embossed sheet as in Example 1. The one-side embossed sheet 11' was arranged between solar cell matrix 14 and transparent panel 13*a*, while its embossed surface was faced toward solar cell matrix 14 and its non-embossed surface (flat surface) was faced toward transparent panel 13*a*. FIG. 13 shows the multilayer arrangement of solar cell module components prior to vacuum lamination.

Reference Example 2

Figure 14:
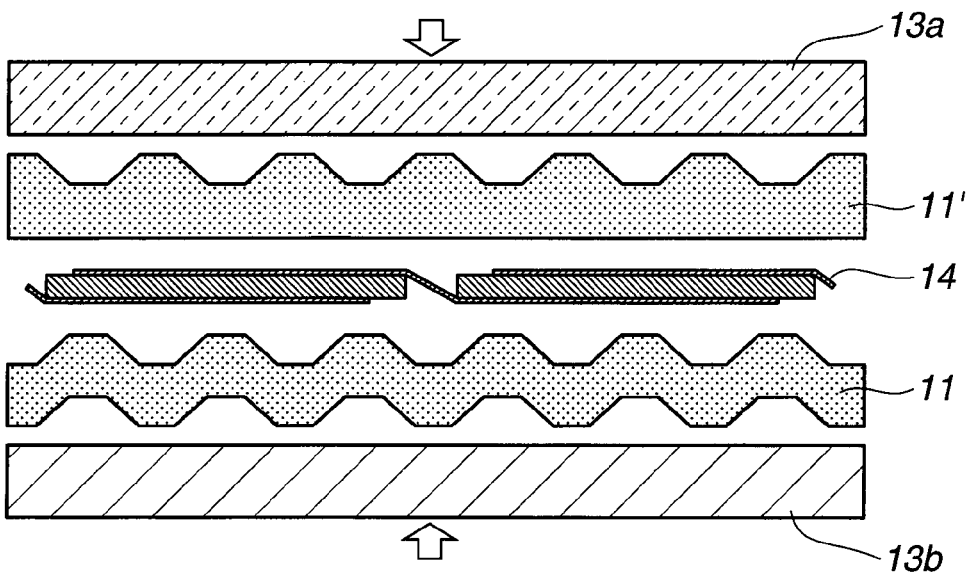
FIG. 14 is a cross-sectional view of a multilayer arrangement of solar cell module components in Reference Example 2.

A solar cell module D was manufactured as in Example 1 except the following changes. One of two silicone rubber sheets in Example 1 was a one-side embossed sheet 11', and the other silicone rubber sheet was a double-side embossed sheet as in Example 1. The one-side embossed sheet 11' was arranged between solar cell matrix 14 and transparent panel 13*a*, while its non-embossed surface (flat surface) was faced toward solar cell matrix 14 and its embossed surface was faced toward transparent panel 13*a*. FIG. 14 shows the multilayer arrangement of solar cell module components prior to vacuum lamination.

Reference Example 3

Figure 15:
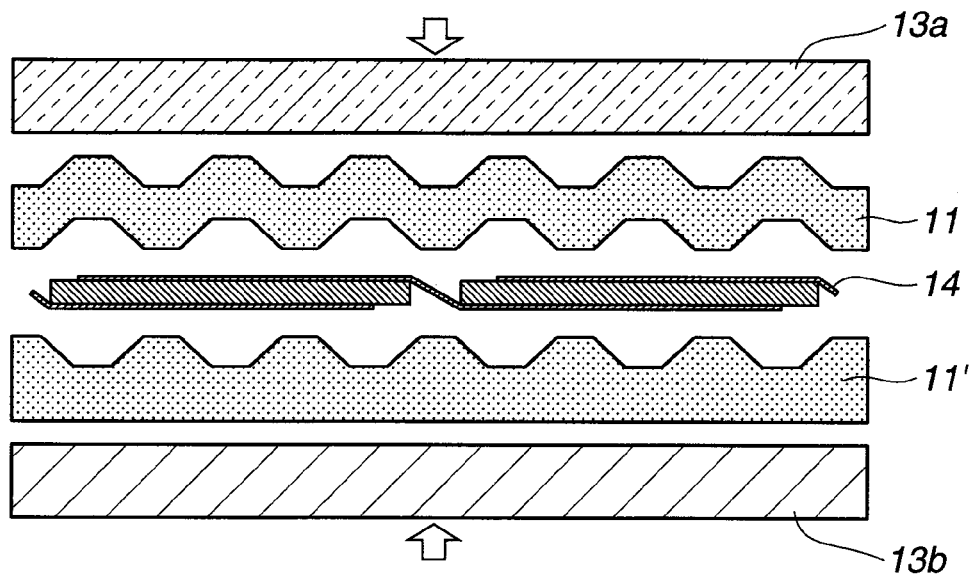
FIG. 15 is a cross-sectional view of a multilayer arrangement of solar cell module components in Reference Example 3.

A solar cell module E was manufactured as in Example 1 except the following changes. One of two silicone rubber sheets in Example 1 was a one-side embossed sheet 11', and the other silicone rubber sheet was a double-side embossed sheet as in Example 1. The one-side embossed sheet 11' was arranged between solar cell matrix 14 and backsheet 13*b*, while its embossed surface was faced toward solar cell matrix 14 and its non-embossed surface (flat surface) was faced toward backsheet 13*b*. FIG. 15 shows the multilayer arrangement of solar cell module components prior to vacuum lamination.

Reference Example 4

Figure 16:
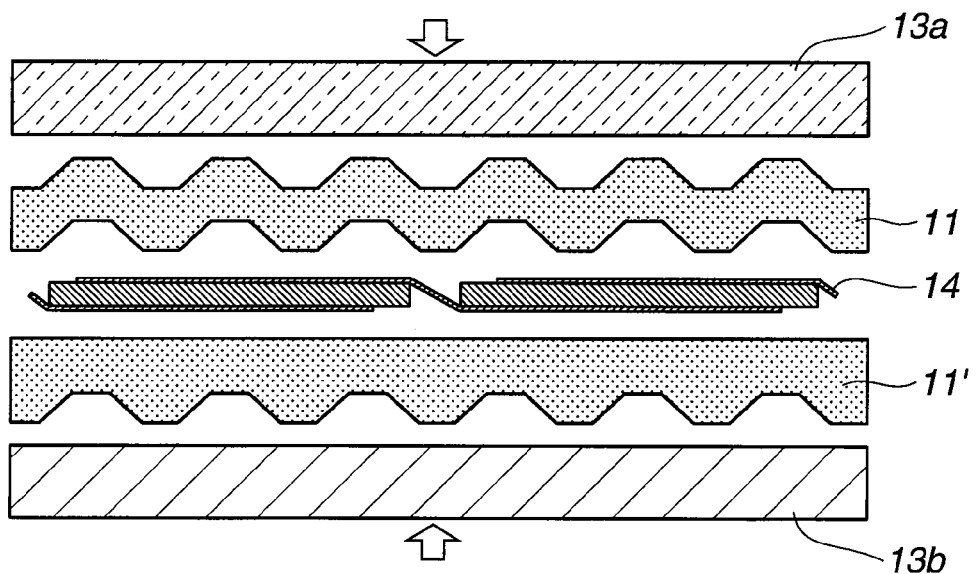
FIG. 16 is a cross-sectional view of a multilayer arrangement of solar cell module components in Reference Example 4.

A solar cell module F was manufactured as in Example 1 except the following changes. One of two silicone rubber sheets in Example 1 was a one-side embossed sheet 11', and the other silicone rubber sheet was a double-side embossed sheet as in Example 1. The one-side embossed sheet 11' was arranged between solar cell matrix 14 and backsheet 13*b* while its non-embossed surface (flat surface) was faced toward solar cell matrix 14 and its embossed surface was faced toward backsheet 13*b*. FIG. 16 shows the multilayer arrangement of solar cell module components prior to vacuum lamination.

For the solar cell modules of Example 1, Comparative Example 1, and Reference Examples 1 to 4, the sealing state by the cured silicone rubber was observed.

Table 1 shows the results of evaluation upon observation. In evaluating the sealing state, the transparent panel 13*a* and backsheet 13*b* of the solar cell module were visually observed from the outside, and a proportion of the area of non-sealed portions (pores) due to air bubbles relative to the entire area of each surface was calculated. The sealing state is judged good (◯) when the proportion is less than 1%, mediocre (Δ) when the proportion is 1% to less than 5%, and poor (x) when the proportion is 5% or more.

Example 2

First, 100 parts of an organopolysiloxane consisting of 99.825 mol % of dimethylsiloxane units, 0.15 mol % of methylvinylsiloxane units, and 0.025 mol % of dimethylvinylsiloxane units and having an average DOP of 8,000 was milled with 80 parts of dry silica having a BET surface area of 200 $m^2$/g (Aerosil 200 by Nippon Aerosil Co., Ltd.) and 5 parts of dimethylpolysiloxane having a silanol group at both ends and a viscosity of 29 mPa·s at 25° C. on a kneader, and heat treated at 180° C. for 2 hours, yielding a base rubber compound.

To the base rubber compound, 0.5 part of platinum catalyst C-25A and 2.0 parts of organohydrogenpolysiloxane C-25B, both available from Shin-Etsu Chemical Co., Ltd., were added as addition curing agent. The mixture was milled on a two-roll mill to form a rubber compound sheet of 5 mm thick.

Using a calendering machine (Nippon Roll Co., Ltd.), the rubber compound sheet of 5 mm thick was calendered at RT into a silicone rubber sheet of 1 mm thick. The green silicone rubber sheet 10 was protected on its both surfaces by sandwiching the sheet between embossing surfaces of diamond embossing films (Ishijima Chemical Industries Co., Ltd., Emboss NEF type, thickness 0.15 mm) as protective film at RT.

Once the embossing film was peeled from one surface of the green silicone rubber sheet, the sheet was rested on a strengthened colorless glass substrate of 340 mm×360 mm×3.2 mm thick (referred to as "transparent panel 13*a*" hereinafter) such that the bare surface of the silicone rubber sheet was faced toward the glass substrate. The assembly was pressure bonded by a pair of silicone rubber rollers (pressing rollers) for laminating the green silicone rubber sheet 10*h* to the glass substrate closely (i.e., without voids). Thereafter, the remaining embossing film was peeled from the surface of the green silicone rubber sheet 10, yielding a laminate 130*a*.

Further, to judge the seal state on the back side, a monolayer transparent PET film of 340 mm×360 mm×0.3 mm thick was used as backsheet 13*b*. As above, once the embossing film was peeled from one surface of the green silicone rubber sheet protected with embossing films, the silicone rubber sheet was rested on the transparent PET film such that the bare surface of the silicone rubber sheet was faced toward the transparent PET film. A pair of silicone rubber rollers (pressure rollers) were used to laminate silicone rubber sheet

TABLE 1

| | Silicone rubber sheet embossing | | Multilayer arrangement | Results of evaluation of sealing state | |
|---|---|---|---|---|---|
| | Transparent panel side | Backsheet side | of module components | Transparent panel side | Backsheet side |
| Example 1 | double side | double side | FIG. 11 | ◯ | ◯ |
| Comparative Example 1 | neither side | neither side | FIG. 12 | x | x |
| Reference Example 1 | one side | double side | FIG. 13 | Δ | ◯ |
| Reference Example 2 | one side | double side | FIG. 14 | x | ◯ |
| Reference Example 3 | double side | one side | FIG. 15 | ◯ | x |
| Reference Example 4 | double side | one side | FIG. 16 | ◯ | x |

10h to the transparent PET film (backsheet 13b) closely (i.e., without voids). Thereafter, the remaining embossing film was peeled from the green silicone rubber sheet 10, yielding a laminate 130b.

Next, as shown in FIG. 7, laminate 130a was rested on a platen 51 with silicone rubber sheet 10 positioned at the top. While the circumferential surface of an embossing roller 52 was kept in pressure contact with the surface of silicone rubber sheet 10, the roller 52 was rotatably moved for transferring the embossing pattern (recess/boss pattern) to the surface of silicone rubber sheet 10, yielding a first laminate 131 in which silicone rubber sheet 11' having the predetermined pattern of recesses and bosses was laminated to one surface of transparent panel 13a. It is noted that embossing roller 52 was a stainless steel roller having a diameter of 40 mm and a length of 400 mm, which was provided on its circumferential surface with a recess/boss pattern or diamond shaped embossing pattern with grooves having a top-bottom difference of 0.3 mm as shown in FIG. 2(a).

Also, a support roller of silicone rubber having a diameter of 40 mm and a length of 400 mm was opposed to the embossing roller 52 with a spacing of 1.15 mm therebetween. While embossing roller 52 was rotatably driven, laminate 130b was inserted between the support roller and embossing roller 52 such that silicone rubber sheet 10 was on the side of embossing roller 52, for thereby transferring the embossing pattern (recess/boss pattern) to the surface of silicone rubber sheet 10. There was obtained a second laminate 132 in which silicone rubber sheet 11' having the predetermined pattern of recesses and bosses was laminated to one surface of backsheet 13b.

A 2/2 series solar cell matrix, which was constructed by arranging monocrystalline silicon solar cell components in a matrix of 2 rows and 2 columns and electrically connecting them in series, was rested on the surface of silicone rubber sheet 11' of first laminate 131. The second laminate 132 was rested thereon such that its silicone rubber sheet 11' might cover the solar cell matrix.

The precursory assembly or laminate as shown in FIG. 10 was set in a vacuum laminator. Once a vacuum was established, the assembly was heated at 110° C. for 3 minutes and compression bonded for 12 minutes under atmospheric pressure, completing a solar cell module G.

Comparative Example 3

In Example 2, a silicone rubber sheet 10 of 1 mm thick was rested on a strengthened colorless glass substrate (transparent panel 13a) of 340 mm×360 mm without laminating treatment. A 2/2 series solar cell matrix, which was constructed by arranging monocrystalline silicon solar cell components in a matrix of 2 rows and 2 columns and electrically connecting them in series, was rested on the surface of silicone rubber sheet 10. A silicone rubber sheet 10 of 1 mm thick was rested so as to cover the solar cell matrix. Finally, a transparent monolayer PET film (backsheet 13b) of 340 mm×360 mm×0.3 mm thick was rested on the silicone rubber sheet 10.

This precursory assembly was set in a vacuum laminator. Once a vacuum was established, the assembly was heated at 110° C. for 3 minutes and compression bonded for 12 minutes under atmospheric pressure, completing a solar cell module H.

For the solar cell modules of Example 2 and Comparative Example 3, the sealing state by the cured silicone rubber was observed.

Table 2 shows the results of evaluation upon observation. The sealing state was evaluated by visually observing the solar cell module from the outside. It was inspected whether or not pores were present between transparent panel 13a and the cured silicone rubber sheet on the surface side, between the cured silicone rubber sheet on the surface side and the solar cell matrix, between the solar cell matrix and the cured silicone rubber sheet on the back side, and between the cured silicone rubber sheet on the back side and backsheet 13b. If pores were found, the size of a pore (maximum diameter on the assumption that the pore is spherical) was observed. The sample was rated non-porous (◯) when no pores were found, somewhat porous (Δ) when pores were found, with all pores having a size (maximum diameter) of less than 5 mm, and porous (x) when pores were found, with some pores having a size (maximum diameter) of 5 mm or greater.

TABLE 2

| | Silicone rubber sheet | | | |
| --- | --- | --- | --- | --- |
| | 1st laminate | | 2nd laminate | |
| | Transparent panel side | Solar cell matrix side | Solar cell matrix side | Backsheet side |
| Example 2 | laminated | embossed | embossed | laminated |
| Comparative Example 3 | rested | no work | no work | rested |

| | Multilayer arrangement of module components |
| --- | --- |
| Example 2 | FIG. 10 |
| Comparative Example 3 | FIG. 12 |

| | Results of evaluation of sealing state | | | |
| --- | --- | --- | --- | --- |
| | Between transparent panel and cured silicone rubber sheet on surface side | Between cured silicone rubber sheet on surface side and solar cell matrix | Between solar cell matrix and cured silicone rubber sheet on back side | Between cured silicone rubber sheet on back side and backsheet |
| Example 2 | ◯ | ◯ | ◯ | ◯ |
| Comparative Example 3 | x | Δ | Δ | x |

In Example 2 wherein the silicone rubber sheets were laminated to the transparent panel and the backsheet closely (i.e., without voids), prior to vacuum lamination treatment, the silicone rubber sheets could be cured without leaving pores. Also in Example 2, since the surface of the silicone rubber sheet adapted to face the solar cell matrix had been embossed, the vacuum lamination treatment needed only brief vacuum pumping before the silicone rubber sheets could be cured without leaving pores between the cured silicone rubber sheet and the solar cell matrix.

While the invention has been described with reference to the preferred embodiments illustrated in the drawings, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

Japanese Patent Application Nos. 2013-179827 and 2014-115750 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a solar cell module by resin encapsulating a solar cell matrix comprising a plurality of electrically connected solar cell components arranged between a transparent panel and a second panel or backsheet, comprising the steps of:
   (1) providing a first laminate by laminating a green silicone rubber sheet of a millable silicone rubber composition to one surface of the transparent panel, the silicone rubber sheet having a predetermined pattern of recesses and bosses on its surface, wherein the recesses are interconnected,
   (2) providing a second laminate by laminating a green silicone rubber sheet of a millable silicone rubber composition to one surface of the second panel or backsheet, the silicone rubber sheet having a predetermined pattern of recesses and bosses on its surface, wherein the recesses are interconnected, and
   (3) mating the first and second laminates together such that the patterned surfaces of the silicone rubber sheets may be opposed to each other, placing the solar cell matrix between the first and second laminates, pumping a space surrounding the laminates to vacuum,
   wherein air in the spaces between the solar cell matrix and the green silicone rubber sheet of the first laminate and between the solar cell matrix and the green silicone rubber sheet of the second laminate is evacuated through channels defined by the interconnected recesses of the green silicone rubber sheets of the first and second laminates upon the vacuum pumping, compressing and heating the first and second laminates in vacuum to cure the silicone rubber sheets for establishing a seal around the solar cell matrix;
   wherein step (1) includes embossing at least one surface of the green silicone rubber sheet of silicone rubber composition and laminating the embossed silicone rubber sheet to the surface of the transparent panel such that the embossed surface of the silicone rubber sheet may be disposed remote from the transparent panel; and
   wherein both surfaces of the green silicone rubber sheet are embossed to have a predetermined pattern of interconnected recesses and bosses on its surfaces, respectively, and wherein air in the spaces between the solar cell matrix and the green silicone rubber sheet of the first laminate and between the transparent panel and the green silicone rubber sheet of the first laminate is evacuated through channels defined by the interconnected recesses of the green silicone rubber sheet of the first laminate upon the vacuum pumping of step (3).

2. The method of claim 1 wherein step (2) includes embossing at least one surface of the green silicone rubber sheet of silicone rubber composition and laminating the embossed silicone rubber sheet to the surface of the second panel or backsheet such that the embossed surface of the silicone rubber sheet may be disposed remote from the second panel or backsheet.

3. The method of claim 2, wherein both surfaces of the green silicone rubber sheet are embossed to have a predetermined pattern of interconnected recesses and bosses on its surfaces, respectively, and wherein air in the spaces between the solar cell matrix and the green silicone rubber sheet of the second laminate and between the second panel or backsheet and the green silicone rubber sheet of the second laminate is evacuated through channels defined by the interconnected recesses of the green silicone rubber sheet of the second laminate upon the vacuum pumping of step (3).

4. The method of claim 1 wherein the embossing step is carried out by pressing two sheet-form templates having a patterned surface against opposite surfaces of the green silicone rubber sheet.

5. The method of claim 4, further comprising the steps of separating one template from either one surface of the green silicone rubber sheet, laminating the embossed surface of the green silicone rubber sheet to the transparent panel, second panel or backsheet so that recesses of the emboss structure may not collapse, then separating the other template from the opposite surface of the green silicone rubber sheet, prior to step (3).

6. The method of claim 1 wherein step (1) includes laminating the green silicone rubber sheet of silicone rubber composition to one surface of the transparent panel and embossing the surface of the silicone rubber sheet laminated to the transparent panel.

7. The method of claim 6 wherein the step of laminating the green silicone rubber sheet to the transparent panel, second panel or backsheet is carried out using a laminator comprising a pressure roller.

8. The method of claim 6 wherein the step of laminating the green silicone rubber sheet to the transparent panel, second panel or backsheet is carried out in vacuum.

9. The method of claim 6 wherein the embossing step includes using a roll having a patterned surface as the template and pressing the roll against the green silicone rubber sheet.

10. The method of claim 1 wherein step (2) includes laminating the green silicone rubber sheet of silicone rubber composition to one surface of the second panel or backsheet and embossing the surface of the silicone rubber sheet laminated to the second panel or backsheet.

11. The method of claim 1 wherein the green silicone rubber sheet has a thickness of 0.3 to 2 mm.

12. The method of claim 1 wherein step (3) includes resting the solar cell matrix on the silicone rubber sheet of the first or second laminate, mating the first and second laminates with the silicone rubber sheets inside, heating and compressing the first and second laminates in vacuum to cure the silicone rubber sheets for establishing a seal around the solar cell matrix.

13. The method of claim 1 wherein step (3) includes heating at a temperature of 70 to 150° C.

14. The method of claim 1 wherein the backsheet is a composite sheet consisting of a polyethylene terephthalate resin film coated on both surfaces with vinyl fluoride resin films.

15. The method of claim 1 wherein the silicone rubber composition comprises
   (A) 100 parts by weight of an organopolysiloxane containing at least two alkenyl groups per molecule and having a degree of polymerization of at least 100, represented by the average compositional formula (I):

$$R^1_a SiO_{(4-a)/2} \tag{I}$$

wherein $R^1$ is independently a substituted or unsubstituted monovalent hydrocarbon group and $a$ is a positive number of 1.95 to 2.05, (B) 10 to 150 parts by weight of reinforcing silica having a specific surface area of at least 50 m²/g, and
(C) a sufficient amount to cure component (A) of a curing agent.

16. The method of claim 15 wherein component (C) is a combination of organo-hydrogenpolysiloxane with a hydrosilylation catalyst, or an organic peroxide.

17. The method of claim 1 wherein step (1) comprises embossing at least one entire surface of the green silicone rubber sheet by a template which includes a diamond pattern of interconnected rhombic embossing units, a lattice pattern of interconnected rectangular embossing units, a network pattern of interconnected circular embossing units, hexagonal pattern of interconnected hexagonal units, a wave pattern of interconnected corrugated embossing units or an irregular pattern of interconnected closed linear embossing units on its surface.

18. The method of claim 1 wherein step (2) comprises embossing at least one entire surface of the green silicone rubber sheet by a template which includes a diamond pattern of interconnected rhombic embossing units, a lattice pattern of interconnected rectangular embossing units, a network pattern of interconnected circular embossing units, hexagonal pattern of interconnected hexagonal units, a wave pattern of interconnected corrugated embossing units or an irregular pattern of interconnected closed linear embossing units on its surface.

* * * * *